(12) United States Patent
Kwon et al.

(10) Patent No.: US 12,457,805 B2
(45) Date of Patent: Oct. 28, 2025

(54) DISPLAY DEVICE, METHOD OF MANUFACTURING THE SAME AND TILED DISPLAY DEVICE INCLUDING THE SAME

(71) Applicant: Samsung Display Co., LTD., Yongin-si (KR)

(72) Inventors: Yong Hoon Kwon, Suwon-si (KR); Mi Sun Kim, Hwaseong-si (KR); Dong Sung Lee, Suwon-si (KR); Se Hun Choi, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 496 days.

(21) Appl. No.: 17/983,618

(22) Filed: Nov. 9, 2022

(65) Prior Publication Data

US 2023/0307462 A1    Sep. 28, 2023

(30) Foreign Application Priority Data

Mar. 25, 2022  (KR) .................. 10-2022-0037251

(51) Int. Cl.
*H10D 86/60*        (2025.01)
*H01L 23/00*        (2006.01)
(Continued)

(52) U.S. Cl.
CPC ............ *H10D 86/60* (2025.01); *H01L 24/03* (2013.01); *H01L 24/05* (2013.01); *H01L 25/167* (2013.01);
(Continued)

(58) Field of Classification Search
CPC .. H10D 86/441; H10D 86/60; H10D 86/0212; H10D 86/411; H10D 86/451;
(Continued)

(56) References Cited

U.S. PATENT DOCUMENTS

2017/0025444 A1* 1/2017 Hirakata ................ H10K 59/40
2017/0179159 A1* 6/2017 Kawata .................. H10D 86/60
(Continued)

FOREIGN PATENT DOCUMENTS

CN         115207044        10/2022
JP         2017-161887       9/2017
(Continued)

*Primary Examiner* — Mouloucoulaye Inoussa
(74) *Attorney, Agent, or Firm* — Womble Bond Dickinson (US) LLP

(57) ABSTRACT

A display device includes a substrate, a first metal layer on the substrate, a first barrier insulating layer on the first metal layer, an etching control layer on the first barrier insulating layer, a first contact hole passing through the substrate, the first barrier insulating layer, and the etching control layer, a second barrier insulating layer on the etching control layer and including a second contact hole, a fan-out line on the second barrier insulating layer and included in a second metal layer, a pad part inserted into the second contact hole and included in the second metal layer, the pad part integral with the fan-out line, a display layer on the fan-out line, and a flexible film under the substrate and inserted into the first contact hole to be electrically connected to the pad part. The first metal layer includes an etching mark adjacent to the first contact hole.

12 Claims, 28 Drawing Sheets

(51) Int. Cl.
    *H01L 25/16*      (2023.01)
    *H10D 86/01*      (2025.01)
    *H10D 86/40*      (2025.01)

(52) U.S. Cl.
    CPC ....... *H10D 86/0212* (2025.01); *H10D 86/441* (2025.01); *H01L 24/16* (2013.01); *H01L 2224/03019* (2013.01); *H01L 2224/03612* (2013.01); *H01L 2224/05571* (2013.01); *H01L 2224/05573* (2013.01); *H01L 2224/16237* (2013.01)

(58) Field of Classification Search
    CPC ..... H10D 86/021; H01L 24/03; H01L 25/167; H01L 25/0753; H01L 24/05; H01L 23/552; H01L 24/16; H01L 2224/03612; H01L 2224/03019; H01L 2224/16237; H01L 2224/05573; H01L 2224/05571; H10H 20/857; H10H 20/0364; H10H 29/10; H10H 29/142; G02F 1/13452; G02F 1/13685; G02F 1/1368; G02F 1/133512; G02F 1/133302; G02F 1/13458; G02F 1/136209; H10K 59/126; H10K 59/131; H10K 77/111; H10K 2102/311; Y02E 10/549; G09F 9/33
See application file for complete search history.

(56) References Cited

U.S. PATENT DOCUMENTS

| | | | |
|---|---|---|---|
| 2017/0338246 A1* | 11/2017 | Kubota | G02F 1/136286 |
| 2018/0138260 A1* | 5/2018 | Kajiyama | H10K 59/123 |
| 2019/0035820 A1* | 1/2019 | Yanaka | H10D 86/0214 |
| 2020/0135811 A1* | 4/2020 | Jung | G02B 1/10 |
| 2022/0052078 A1* | 2/2022 | Kim | H10D 86/441 |
| 2022/0052079 A1* | 2/2022 | Jang | H01L 25/18 |
| 2022/0077195 A1* | 3/2022 | Jeong | G02F 1/13336 |
| 2022/0093677 A1* | 3/2022 | Jeong | H10H 20/857 |
| 2022/0093881 A1* | 3/2022 | Yueh | H10K 77/111 |
| 2022/0208850 A1* | 6/2022 | Im | H10D 86/441 |
| 2022/0208950 A1* | 6/2022 | Park | H10K 59/18 |
| 2022/0223436 A1* | 7/2022 | Cho | H01L 21/6708 |
| 2022/0293636 A1* | 9/2022 | Lee | H10D 86/60 |
| 2022/0328724 A1* | 10/2022 | Jang | H10H 29/142 |
| 2022/0384492 A1* | 12/2022 | Lu | H10D 86/451 |
| 2022/0392990 A1* | 12/2022 | Shin | H10K 59/18 |

FOREIGN PATENT DOCUMENTS

| | | |
|---|---|---|
| KR | 10-0666636 | 1/2007 |
| KR | 10-2021-0019633 | 2/2021 |
| KR | 10-2022-0142597 | 10/2022 |

* cited by examiner

SP: SP1, SP2, SP3

DPL: TFTL, EML, WLCL, CFL
TFT: SE, GE, ACT, DE
MTL1: ECM
MTL2: FOL, PAD
MTL3: CWL, VL1, VL2
ACTL: ACT, DE, SE
MTL4: GE
MTL5: CNE1, CNE2

DPL: TFTL, EML, WLCL, CFL
TFT: SE, GE, ACT, DE
MTL1: ECM
MTL2: FOL, PAD
MTL3: CWL, VL1, VL2
ACTL: ACT, DE, SE
MTL4: GE
MTL5: CNE1, CNE2

DISPLAY DEVICE, METHOD OF MANUFACTURING THE SAME AND TILED DISPLAY DEVICE INCLUDING THE SAME

CROSS-REFERENCE TO RELATED APPLICATION(S)

This application claims priority to and benefits of Korean Patent Application No. 10-2022-0037251 under 35 U.S.C. § 119, filed on Mar. 25, 2022, in the Korean Intellectual Property Office (KIPO), the entire contents of which are incorporated herein by reference.

BACKGROUND

1. Technical Field

Embodiments relate to a display device, a method of manufacturing the display device and a tiled display device including the display device.

2. Description of the Related Art

With the advance of information-oriented society, more and more demands are placed on display devices for displaying images in various ways. For example, the display devices have been implemented in various electronic devices such as smartphones, digital cameras, laptop computers, navigation devices, and smart televisions. The display devices include flat panel display devices such as a liquid crystal display device, a field emission display device and an organic light emitting display device. In the flat panel display devices, since each of pixels of a display panel includes a light emitting element capable of emitting light by itself, an image may be displayed without a backlight unit providing light to the display panel.

In case that the display devices are manufactured in a large size, a defect rate of the light emitting element may increase due to an increase in the number of pixels, thereby deteriorating productivity or reliability of the display devices. To solve this problem, in a tiled display device, a large-sized screen may be implemented by connecting a plurality of display devices having a small size. The tiled display device may include a boundary portion called a seam between the plurality of display devices, due to a non-display area or a bezel area of each of the plurality of display devices adjacent to each other. In case that a single image is displayed on the entire screen, the boundary portion between the plurality of display devices causes a sense of disconnection over the entire screen, thereby reducing a sense of immersion in the image.

SUMMARY

Embodiments provide a display device capable of increasing an etching rate and reducing manufacturing cost, a method of manufacturing the display device, and a tiled display device including the display device.

Embodiments provide a tiled display device capable of removing or minimizing a sense of disconnection between a plurality of display devices and improving image immersion by preventing a boundary portion or a non-display area between the plurality of display devices from being recognized, the method of manufacturing the display device, and the tiled display device including the display device.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a display device may include a substrate, a first metal layer disposed on the substrate, a first barrier insulating layer disposed on the first metal layer, an etching control layer disposed on the first barrier insulating layer, a first contact hole passing through the substrate, the first barrier insulating layer, and the etching control layer, a second barrier insulating layer disposed on the etching control layer and including a second contact hole, a fan-out line disposed on the second barrier insulating layer and included in a second metal layer; a pad part inserted into the second contact hole and included in the second metal layer, the pad part being integral with the fan-out line; a display layer disposed on the fan-out line, and a flexible film disposed under the substrate and inserted into the first contact hole to be electrically connected to the pad part. The first metal layer may include an etching mark adjacent to the first contact hole.

The etching control layer may include an insulating material including polyimide.

The etching mark may include at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The etching mark may be disposed on a side of the first contact hole.

The display device may further include a protective film disposed under the substrate, and a weak adhesive portion surrounding the first contact hole in a plan view and being surrounded by the protective film.

The weak adhesive portion may be formed by reducing an adhesive of a portion of the protective film.

The display layer may include a connection part disposed on the second metal layer and included in a third metal layer, the connection part connected to the fan-out line, a data line included in the third metal layer and extending in a first direction, and a high potential line included in the third metal layer and extending in the first direction.

The pad part may be to supply a data voltage to the data line through the connection part, or may be to supply a high potential voltage to the high potential line through the connection part.

The display device may further include a thin film transistor including a gate electrode included in a fourth metal layer and an active layer overlapping the gate electrode, and a connection electrode included in a fifth metal layer on the fourth metal layer. An end portion of the connection electrode may be connected to the high potential line, and another end portion of the connection electrode may be connected to the active layer of the thin film transistor.

The display layer may further include a light emitting element layer disposed on the fifth metal layer. The light emitting element layer may include a first electrode connected to the connection electrode, a second electrode adjacent to the first electrode, the first electrode and the second electrode disposed on a same layer, and a light emitting element disposed between the first electrode and the second electrode.

The display device may further include a display driver mounted on the flexible film to supply a data voltage, a power voltage, or a gate signal.

According to an embodiment, a method of manufacturing a display device may include providing a substrate, forming a first metal layer on the substrate, forming a first barrier insulating layer on the first metal layer, forming an etching control layer on the first barrier insulating layer, forming a second barrier insulating layer on the etching control layer, the second barrier insulating layer including a second contact hole, forming a fan-out line disposed on the second barrier insulating layer and a pad part inserted into the second contact hole, the fan-out line and the pad part being integral with each other, forming a display layer on the fan-out line, performing a first etching process of etching the substrate, the first metal layer, and the first barrier insulating layer, performing a second etching process of etching the etching control layer to form a first contact hole, and inserting a flexible film into the first contact hole to electrically connect the flexible film to the pad part.

The first etching process may be an atmospheric pressure plasma process by using an etching gas including at least one of nitrogen trifluoride ($NF_3$), carbon tetrafluoride ($CF_4$), fluoromethane ($CH_3F$), and difluoromethane ($CH_2F_2$).

The performing of the first etching process may include controlling an etching depth by removing the first metal layer.

The performing of the first etching process may include forming an etching mark by removing the first metal layer.

The second etching process may be an atmospheric pressure plasma process by using an etching gas that does not include fluorine (F) radicals.

The method may further include, after forming the display layer, forming a protective film on a surface of the substrate, and forming a weak adhesive portion by reducing an adhesive of a portion of the protective film. The performing of the first etching process and the performing of the second etching process may include removing the weak adhesive portion from a lower portion of the substrate to etch the substrate, the first metal layer, the first barrier insulating layer, and the etching control layer.

The method may further include, after performing the second etching process, protecting the pad part by covering the first contact hole with the weak adhesive portion.

The protecting of the pad part may include disposing a film adhesive on an edge portion of the weak adhesive portion to fix the weak adhesive portion to an opening of the first contact hole.

According to an embodiment, a tiled display device may include a plurality of display devices, each of the plurality of display devices including a display area including a plurality of pixels and a non-display area surrounding the display area, and a bonding member that bonds the plurality of display devices. Each of the plurality of display devices may include a substrate, a first metal layer disposed on the substrate, a first barrier insulating layer disposed on the first metal layer, an etching control layer disposed on the first barrier insulating layer, a first contact hole pass through the substrate, the first barrier insulating layer, and the etching control layer, a second barrier insulating layer disposed on the etching control layer and including a second contact hole, a fan-out line disposed on the second barrier insulating layer and included in a second metal layer, a pad part inserted into the second contact hole and included in the second metal layer, the pad part being integral with the fan-out line, a display layer disposed on the fan-out line, and a flexible film disposed under the substrate and inserted into the first contact hole to be electrically connected to the pad part. The first metal layer may include an etching mark adjacent to the first contact hole.

According to the display device, the method for manufacturing the display device, and the tiled display device including the display device according to the embodiments, an etching depth is adjusted by using an etching mark in a first etching process, and an etching gas that does not include a fluorine radical is used in a second etching process to prevent damage to a pad part, so that it is possible to significantly increase the etching rate and reduce the manufacturing cost.

According to the display device, the method of manufacturing the display device, and the tiled display device including the display device according to embodiments, the area of the non-display area of the display device may be minimized by electrically connecting a display driver disposed under a substrate to a connection part on the substrate. Accordingly, the display device, the method of manufacturing the display device, and the tiled display device including the display device may prevent a user from recognizing the non-display area or the boundary portion between the plurality of display devices by minimizing a gap between the plurality of display devices.

However, the effects of the disclosure are not limited to the aforementioned effects, and various other effects are included in the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
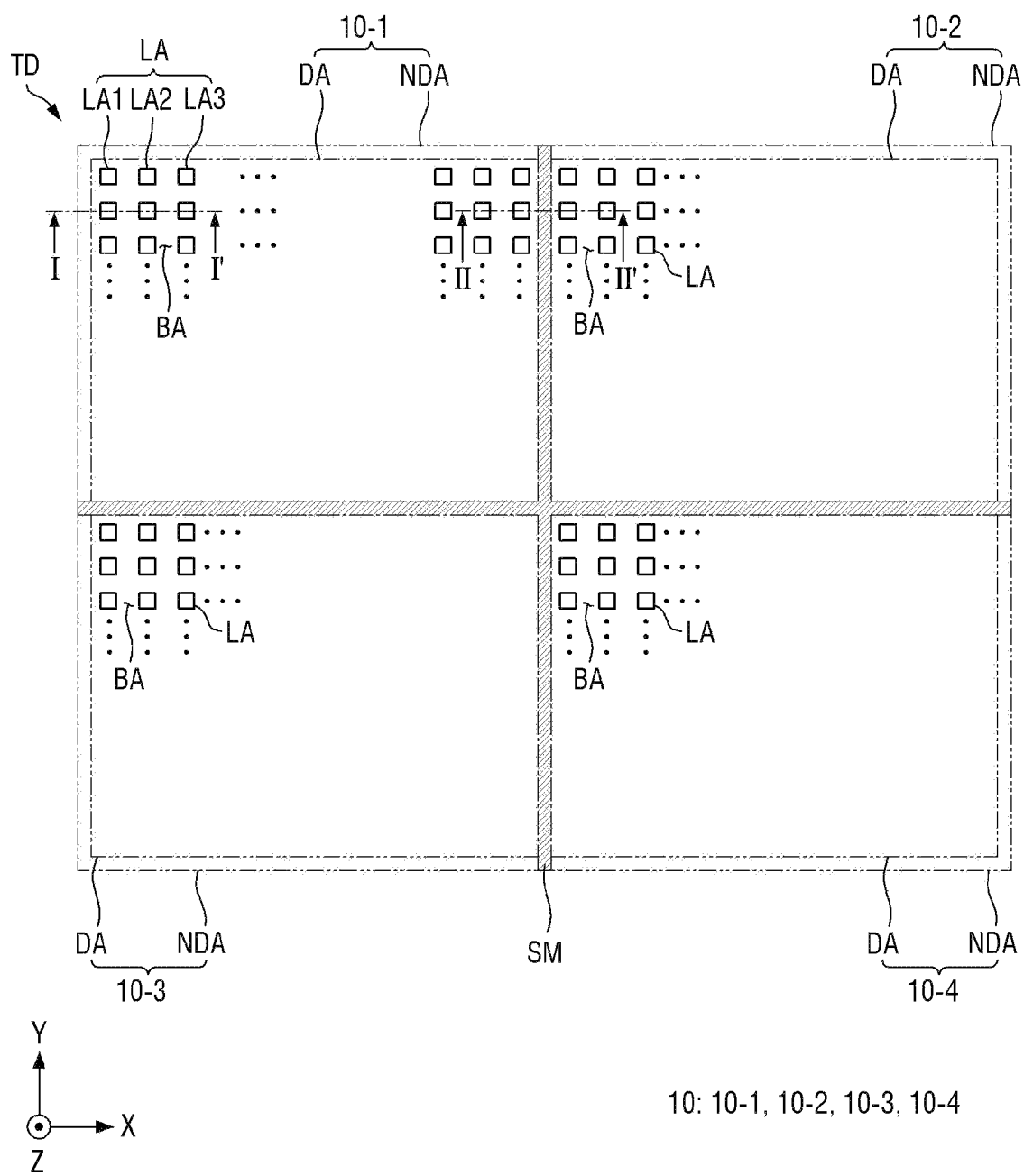
FIG. 1 is a schematic plan view illustrating a tiled display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. In case that an embodiment may be implemented differently, a specific process order may be performed differently from the described order. For example, two consecutively described processes may be performed substantially at the same time or performed in an order opposite to the described order. Also, like reference numerals denote like elements.

In case that an element, such as a layer, is referred to as being "on," "connected to," or "coupled to" another element or layer, it may be directly on, connected to, or coupled to the other element or layer or intervening elements or layers may be present. In case that, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," in case that used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Hereinafter, detailed embodiments of the disclosure will be described with reference to the accompanying drawings.

FIG. 1 is a schematic plan view illustrating a tiled display device according to an embodiment.

Referring to FIG. 1, a tiled display device TD may include display devices 10 (e.g., 10-1, 10-2, 10-3, and 10-4). The display devices 10 may be arranged in a grid form, but embodiments are not limited thereto. The display devices 10 may be connected to each other in the first direction (e.g., X-axis direction) or the second direction (e.g., Y-axis direction), and the tiled display device TD may have a particular shape. For example, the display devices 10 may have the same size, but embodiments are not limited thereto. For another example, the display devices 10 may have different sizes.

The tiled display device TD may include first to fourth display devices 10-1, 10-2, 10-3, and 10-4. The number and connection relationship of the display devices 10 are not limited to the embodiment of FIG. 1. The number of the display devices 10 may be determined according to the size of each of the display devices 10 and the tiled display device TD.

Each display device 10 may have a rectangular shape including long sides and short sides. The display devices 10 may be arranged such that the long sides or the short sides thereof are connected to each other. Some of the display devices 10 may be disposed at the edge portion of the tiled display device TD to form a side of the tiled display device TD. Some others of the display devices 10 may be disposed at corners of the tiled display device TD to form two adjacent sides of the tiled display device TD. The others of the display devices 10 may be disposed on the inner side of the tiled display device TD, and may be surrounded by other display devices 10.

Each of the display devices 10 may include a display area DA and a non-display area NDA. The display area DA may include pixels to display an image. Each of the pixels may include an organic light emitting diode including an organic light emitting layer, a quantum dot LED including a quantum dot light emitting layer, a micro LED, or an inorganic LED including an inorganic semiconductor. In the following, the case where each of the pixels includes an inorganic light emitting diode will be described, but embodiments are not limited thereto. The non-display area NDA may be disposed around the display area DA to surround the display area DA, and may not display an image.

Each display device 10 may include pixels arranged along rows and columns in the display area DA. Each of the pixels may include an emission area LA defined by a pixel defining layer or bank, and may emit light having a specific peak wavelength through the emission area LA. For example, the display area DA of each display device 10 may include first to third emission areas LA1, LA2, and LA3. Each of the first to third emission areas LA1, LA2, and LA3 may be an area in which light generated from a light emitting element of each display device 10 is emitted to the outside of each display device 10.

The first to third emission areas LA1, LA2, and LA3 may emit light having a specific peak wavelength to the outside of each display device 10. The first emission area LA1 may emit a first color light, the second emission area LA2 may emit a second color light, and the third emission area LA3 may emit a third color light. For example, the first color light may be red light having a peak wavelength in the range of about 610 nm to about 650 nm, the second color light may be green light having a peak wavelength in the range of about 510 nm to about 550 nm, and the third color light may be blue light having a peak wavelength in the range of about 440 nm to about 480 nm, but embodiments are not limited thereto.

The first to third emission areas LA1, LA2, and LA3 may be sequentially arranged repetitively in the first direction (e.g., X-axis direction) in the display area DA. For example, the size of the third emission area LA3 may be larger than that of the first emission area LA1, and the size of the first emission area LA1 may be larger than that of the second emission area LA2. However, embodiments are not limited thereto. For another example, the first emission area LA1, the second emission area LA2, and the third emission area LA3 may be substantially the same in size.

The display area DA of each display device 10 may include a light blocking area BA surrounding the emission areas LA. The light blocking area BA may prevent the colored lights emitted from the first to third emission areas LA1, LA2, and LA3 from mixing with one another.

The tiled display device TD may have a planar shape as a whole, but embodiments are not limited thereto. The tiled display device TD may have a three-dimensional shape to provide a three-dimensional effect to a user. For example, in case that the tiled display device TD has a three-dimensional shape, at least some of the display devices 10 may have a curved shape. For another example, the display devices 10 may each have a planar shape and may be connected to each other at a specific angle, so that the tiled display device TD may have a three-dimensional shape.

The tiled display device TD may include a coupling area SM disposed between display areas DA. The tiled display device TD may be formed by connecting non-display areas NDA of the adjacent display devices 10. The display devices 10 may be connected to each other through a bonding member or an adhesive member disposed in the coupling area SM. The coupling area SM may not include the pad part or the flexible film attached (or coupled) to the pad part. Accordingly, the distance between the display areas DA of the display devices 10 may be small so that the coupling area SM may not be recognized or viewed by the user. Further, the reflectance of external light of the display areas DA of the display devices 10 may be substantially the same as that of the coupling area SM. Accordingly, in the tiled display device TD, the coupling area SM between the display devices 10 may be prevented from being recognized by the user, thereby reducing a sense of disconnection between the display devices 10 and improving a sense of immersion in an image.

Figure 2:
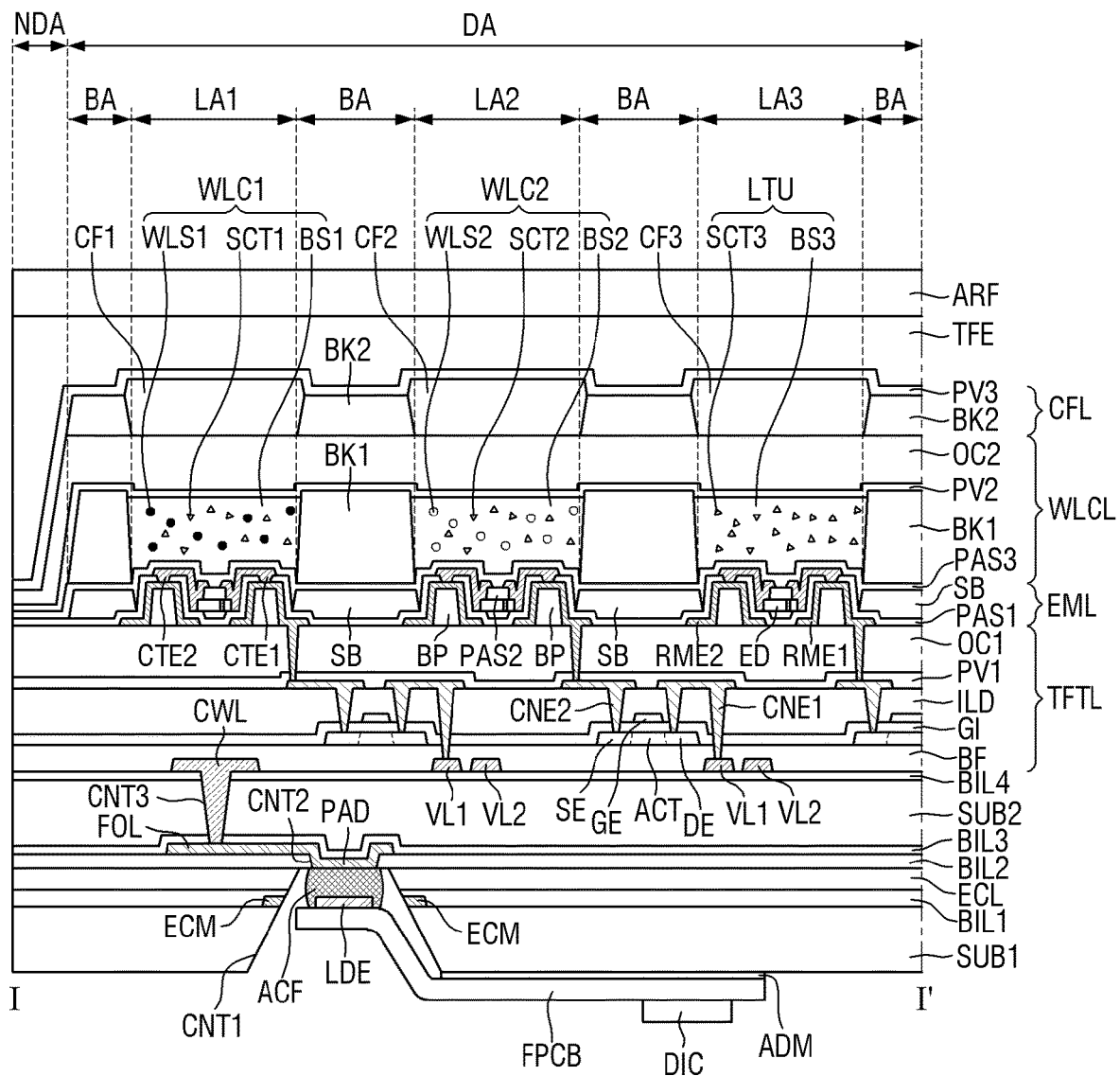
FIG. 2 is an example of a schematic cross-sectional view taken along line I-I' of FIG. 1.

FIG. 2 is an example of a schematic cross-sectional view taken along line I-I' of FIG. 1.

Referring to FIG. 2, the display area DA of each display device 10 may include the first to third emission areas LA1, LA2, and LA3. Each of the first to third emission areas LA1, LA2, and LA3 may be an area in which light generated from the light emitting element ED of each display device 10 is emitted to the outside of each display device 10.

Each display device 10 may include a first substrate SUB1, a first metal layer MTL1, a first barrier insulating layer BIL1 an etching control layer ECL, a second barrier insulating layer BIL2, a second metal layer MTL2, a third barrier insulating layer BIL3, a second substrate SUB2, a fourth barrier insulating layer BIL4, a display layer DPL, an encapsulation layer TFE, an anti-reflection film ARF, a flexible film FPCB, and a display driver DIC.

The first substrate SUB1 may support each display device 10. The first substrate SUB1 may be a base substrate or a base member. The first substrate SUB1 may be a flexible substrate which may be bent, folded or rolled. For example, the first substrate SUB1 may include an insulating material such as a polymer resin such as polyimide (PI), but embodiments are not limited thereto. As another example, the first substrate SUB1 may be a rigid substrate including a glass material.

The first metal layer MTL1 may be disposed on the first substrate SUB1. The first metal layer MTL1 may include at least one etching mark ECM. The etching mark ECM may be adjacent to a first contact hole CNT1. The etching mark ECM may be formed by removing a part of the first metal layer MTL1 during the formation of the first contact hole CNT1. A first side surface of the etching mark ECM may be covered by the first barrier insulating layer BIL1 and a second side surface opposite to the first side surface of the etching mark ECM may be exposed by the first contact hole CNT1. The etching mark ECM may control an etching depth in an etching process of the first substrate SUB1. After confirming that the first metal layer MTL1 is removed in the first etching process, the manufacturer of the display devices 10 may change the etching gas to perform the second etching process. For example, the first etching process may be an atmospheric pressure plasma process by using an etching gas containing at least one of nitrogen trifluoride ($NF_3$), carbon tetrafluorocarbon ($CF_4$), methane fluoride ($CH_3F$), or methane difluoride ($CH_2F_2$), and the second etching process may be an atmospheric pressure plasma process by using an etching gas that does not include the fluorine radical (F-Radical), but embodiments are not limited thereto. The etching mark ECM may be formed of a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The first barrier insulating layer BIL1 may be disposed on the first metal layer MTL1 and the first substrate SUB1. The first barrier insulating layer BIL1 may include an inorganic layer capable of preventing permeation of air or moisture. For example, the first barrier insulating layer BIL1 may include at least one of a silicon nitride layer, a silicon oxynitride layer, a silicon oxide layer, a titanium oxide layer, an aluminum oxide layer, or an amorphous silicon layer, but embodiments are not limited thereto.

The etching control layer ECL may be disposed on the first barrier insulating layer BIL1. The etching control layer ECL may protect the bottom surface (or the lower surface) of a pad part PAD in the first etching process, and may be partially removed in the second etching process to expose the pad part PAD. For example, the etching control layer ECL may include an insulating material such as a polymer resin such as polyimide (PI), but embodiments are not limited thereto.

The first substrate SUB1, the first barrier insulating layer BIL1 and the etching control layer ECL may include the first contact hole CNT1. The first contact hole CNT1 may be etched from the bottom surface (or the lower surface) of the first substrate SUB1 to penetrate to the top surface (or the upper surface) of the etching control layer ECL. For example, the first contact hole CNT1 may pass through the first substrate SUB1, the first barrier insulating layer BIL1 and the etching control layer ECL. For example, the lower width of the first contact hole CNT1 may be greater than the upper width of the first contact hole CNT1. During the manufacturing process of the display devices 10, the pad part PAD inserted (or disposed) into a second contact hole CNT2 may be exposed by the first contact hole CNT1, and the pad part PAD may be connected (e.g., electrically connected) to a lead electrode LDE of the flexible film FPCB through the connection film ACF inserted (or disposed) into the first contact hole CNT1.

The second barrier insulating layer BIL2 may be disposed on the etching control layer ECL. The second barrier insulating layer BIL2 may include an inorganic layer capable of preventing permeation of air or moisture. For example, the second barrier insulating layer BIL2 may include at least one of a silicon nitride layer, a silicon oxynitride layer, a silicon oxide layer, a titanium oxide layer, an aluminum oxide layer, or an amorphous silicon layer, but embodiments are not limited thereto.

The second barrier insulating layer BIL2 may include the second contact hole CNT2. The second contact hole CNT2 may be etched from the top surface (or the upper surface) of the second barrier insulating layer BIL2 to penetrate the bottom surface (or the lower surface) of the second barrier insulating layer BIL2. For example, the upper width of the second contact hole CNT2 may be greater than the lower width of the second contact hole CNT2.

The second metal layer MTL2 may be disposed on the second barrier insulating layer BIL2. The second metal layer MTL2 may include a fan-out line FOL. The second metal layer MTL2 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

For example, the pad part PAD may be included in the second metal layer MTL2. The pad part PAD may be integral with the fan-out line FOL and inserted (or disposed) into the second contact hole CNT2. The pad part PAD may connect (e.g., electrically connect) the flexible film FPCB and the connection part CWL. The pad part PAD may be exposed through the first contact hole CNT1. The pad part PAD may be connected (e.g., electrically connected) to the lead electrode LDE of the flexible film FPCB through the connection film ACF. The fan-out line FOL may be connected (e.g., electrically connected) to a data line, a power line, or a gate line through the connection part CWL. The data line or the power line may be connected to the drain electrode DE of the thin film transistor TFT. The gate line may be connected to the gate electrode GE of the thin film transistor TFT. Accordingly, the fan-out line FOL may supply a data voltage, a power voltage, or a gate signal received from the display driver DIC of the flexible film FPCB to the thin film transistor TFT of the pixel through the connection part CWL. Each display device 10 may include the fan-out line FOL disposed in the display area DA, so that the area of the non-display area NDA may be minimized.

The third barrier insulating layer BIL3 may be disposed on the second barrier insulating layer BIL2 and the second metal layer MTL2. The third barrier insulating layer BIL3 may include an inorganic layer capable of preventing permeation of air or moisture. For example, the third barrier insulating layer BIL3 may include at least one of a silicon nitride layer, a silicon oxynitride layer, a silicon oxide layer, a titanium oxide layer, an aluminum oxide layer, or an amorphous silicon layer, but embodiments are not limited thereto.

The second substrate SUB2 may be disposed on the third barrier insulating layer BIL3. The second substrate SUB2 may be a base substrate or a base member. The second substrate SUB2 may be a flexible substrate which may be bent, folded or rolled. For example, the second substrate SUB2 may include an insulating material such as a polymer resin such as polyimide (PI), but embodiments are not limited thereto.

The fourth barrier insulating layer BIL4 may be disposed on the second substrate SUB2. The fourth barrier insulating layer BIL4 may include an inorganic layer capable of preventing permeation of air or moisture. For example, the fourth barrier insulating layer BIL4 may include at least one of a silicon nitride layer, a silicon oxynitride layer, a silicon oxide layer, a titanium oxide layer, an aluminum oxide layer, or an amorphous silicon layer, but embodiments are not limited thereto.

The fourth barrier insulating layer BIL4, the second substrate SUB2, and the third barrier insulating layer BIL3 may include a third contact hole CNT3. The third contact hole CNT3 may be etched from the top surface (or the upper surface) of the fourth barrier insulating layer BIL4 to penetrate (or pass through) the bottom surface (or the lower surface) of the third barrier insulating layer BIL3. For example, the upper width of the third contact hole CNT3 may be greater than the lower width of the third contact hole CNT3. During the manufacturing process of the display devices 10, the top surface (or the upper surface) of the fan-out line FOL may be exposed by the third contact hole CNT3, and the fan-out line FOL may be in contact with the connection part CWL inserted (or disposed) into the third contact hole CNT3.

The display layer DPL may be disposed on the fourth barrier insulating layer BIL4. The display layer DPL may include a thin film transistor layer TFTL, a light emitting element layer EML, a wavelength conversion layer WLCL and a color filter layer CFL. The thin film transistor layer TFTL may include the third metal layer MTL3, the buffer layer BF, the active layer ACTL, the gate insulating layer GI, the fourth metal layer MTL4, the interlayer insulating layer ILD, the fifth metal layer MTL5, the first passivation layer PV1, and the first planarization layer OC1.

The third metal layer MTL3 may be disposed on the fourth barrier insulating layer BIL4. The third metal layer MTL3 may include the connection part CWL and first and second voltage lines VL1 and VL2. The connection part CWL and the first and second voltage lines VL1 and VL2 may be formed of the same material, and may be disposed in the same layer, but embodiments are not limited thereto. For example, the third metal layer MTL3 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The connection part CWL may be inserted (or disposed) into the third contact hole CNT3 to be connected to the fan-out line FOL. For example, the connection part CWL may be connected (e.g., electrically connected) to a data line to supply a data voltage to the thin film transistor TFT. The connection part CWL may be connected (e.g., electrically connected) to a power line to supply a power voltage to the thin film transistor TFT. The connection part CWL may be connected (e.g., electrically connected) to a gate line to supply a gate signal to the gate electrode GE of the thin film transistor TFT. Accordingly, the connection part CWL may supply the data voltage, the power voltage, or the gate signal received from the display driver DIC through the fan-out line FOL to the thin film transistor TFT of the pixel.

The first and second voltage lines VL1 and VL2 may extend in the second direction (e.g., Y-axis direction) in the display area DA. Each of the first and second voltage lines VL1 and VL2 may be connected (e.g., electrically connected) to the fan-out line FOL. Each of the first and second voltage lines VL1 and VL2 may be connected (e.g., electrically connected) to the thin film transistor TFT or the light emitting element ED. For example, each of the first and second voltage lines VL1 and VL2 may be a data line, a high potential line, a low potential line, or a sensing line, but embodiments are not limited thereto.

The buffer layer BF may be disposed on the third metal layer MTL3 and the fourth barrier insulating layer BIL4. The buffer layer BF may include an inorganic material capable of preventing permeation of air or moisture. For example, the buffer layer BF may include inorganic layers laminated alternately.

The active layer ACTL may be disposed on the buffer layer BF. The active layer ACTL may include a semiconductor region ACT, a drain electrode DE, and a source electrode SE of the thin film transistor TFT. The semiconductor region ACT may overlap the gate electrode GE in the thickness direction (e.g., Z-axis direction), and may be insulated from the gate electrode GE by the gate insulating layer GI. The drain electrode DE and the source electrode SE may be formed by doping the semiconductor region ACT with dopants or impurities (e.g., n-type dopant or p-type dopant). The thin film transistor TFT may constitute a pixel circuit of each of the pixels. For example, the thin film transistor TFT may be a switching transistor or a driving transistor of the pixel circuit.

The gate insulating layer GI may be disposed on the active layer ACTL and the buffer layer BF. The gate insulating layer GI may insulate the gate electrode GE from the semiconductor region ACT of the thin film transistor TFT. The gate insulating layer GI may include a contact hole through which each of the first and second connection electrodes CNE1 and CNE2 passes.

The fourth metal layer MTL4 may be disposed on the gate insulating layer GI. The fourth metal layer MTL4 may include the gate electrode GE of the thin film transistor TFT. The gate electrode GE may overlap the semiconductor region ACT with the gate insulating layer GI interposed therebetween. The gate electrode GE may receive a gate signal from the gate line. For example, the fourth metal layer MTL4 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The interlayer insulating layer ILD may be disposed on the fourth metal layer MTL4. The interlayer insulating layer ILD may insulate the third and fourth metal layers MTL3 and MTL4. The interlayer insulating layer ILD may include a contact hole through which each of the first and second connection electrodes CNE1 and CNE2 passes.

The fifth metal layer MTL5 may be disposed on the interlayer insulating layer ILD. The fifth metal layer MTL5 may include the first and second connection electrodes CNE1 and CNE2. The first and second connection electrodes CNE1 and CNE2 may be formed of the same material, and may be disposed in the same layer, but embodiments are not limited thereto. For example, the fifth metal layer MTL5 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The first connection electrode CNE1 may connect (e.g., electrically connect) the first voltage line VL1 to the drain electrode DE of the thin film transistor TFT. An end portion of the first connection electrode CNE1 may be in contact with the first voltage line VL1 of the third metal layer MTL3, and another end portion of the first connection electrode CNE1 may be in contact with the drain electrode DE of the active layer ACTL.

The second connection electrode CNE2 may connect (e.g., electrically connect) the source electrode SE of the thin film transistor TFT to a first electrode RME1. An end portion of the second connection electrode CNE2 may be in contact with the source electrode SE of the active layer ACTL, and the first electrode RME1 of the light emitting element layer EML may be in contact with another end portion of the second connection electrode CNE2.

The first passivation layer PV1 may be disposed on the fifth metal layer MTL5 and the interlayer insulating layer ILD. The first passivation layer PV1 may protect the thin film transistor TFT. The first passivation layer PV1 may include a contact hole through which the first electrode RME1 passes.

The first planarization layer OC1 may be disposed on the first passivation layer PV1 to flatten the upper end portion of the thin film transistor layer TFTL. For example, the first planarization layer OC1 may include a contact hole through which the first electrode RME1 passes. Here, the contact hole of the first planarization layer OC1 may be connected to the contact hole of the first passivation layer PV1. The first planarization layer OC1 may contain an organic insulating material such as polyimide (PI).

The light emitting element layer EML may be disposed on the thin film transistor layer TFTL. The light emitting element layer EML may include a protruding pattern BP, the first electrode RME1, a second electrode RME2, a first insulating layer PAS1, a sub-bank SB, the light emitting element ED, a second insulating layer PAS2, a first contact electrode CTE1, a second contact electrode CTE2, and a third insulating layer PAS3.

The protruding pattern BP may be disposed on the first planarization layer OC1. The protruding pattern BP may protrude from the top surface (or the upper surface) of the first planarization layer OC1. The protruding pattern BP may include a plurality of protruding patterns BP disposed in an opening area or the emission area LA of each of the pixels. Light emitting elements ED may be arranged between the protruding patterns BP. The protruding pattern BP may have inclined side surfaces, and the light emitted from the light emitting elements ED may be reflected by the first and second electrodes RME1 and RME2 arranged on the protruding patterns BP. For example, the protruding pattern BP may include an organic insulating material such as polyimide (PI).

The first electrode RME1 may be disposed on the first planarization layer OC1 and the protruding pattern BP. The first electrode RME1 may be disposed on the protruding pattern BP positioned on a side of the light emitting elements ED. The first electrode RME1 may be disposed on the inclined surfaces of the protruding pattern BP and reflect the light emitted from the light emitting element ED. The first electrode RME1 may be inserted (or disposed) into the contact hole provided in the first planarization layer OC1 and the first passivation layer PV1 and connected to the second connection electrode CNE2. The first electrode RME1 may be connected (e.g., electrically connected) to an end portion of the light emitting element ED through the first contact electrode CTE1. For example, the first electrode RME1 may receive a voltage that is proportional to the luminance of the light emitting element ED from the thin film transistor TFT of the pixel.

The second electrode RME2 may be disposed on the first planarization layer OC1 and the protruding pattern BP. The second electrode RME2 may be disposed on the protruding pattern BP positioned on another side of the light emitting elements ED. The second electrode RME2 may be disposed on the inclined surfaces of the protruding pattern BP and reflect the light emitted from the light emitting element ED. The second electrode RME2 may be connected (e.g., electrically connected) to another end portion of the light emitting element ED through the second contact electrode CTE2. For example, the second electrode RME2 may receive a low potential voltage supplied from a low potential line to all the pixels.

The first and second electrodes RME1 and RME2 may contain a conductive material having high reflectivity. For example, the first and second electrodes RME1 and RME2 may contain at least one of aluminum (Al), silver (Ag), copper (Cu), nickel (Ni), or lanthanum (La). For another example, the first and second electrodes RME1 and RME2 may include a material such as indium tin oxide (ITO), indium zinc oxide (IZO), and indium tin zinc oxide (ITZO). In still another example, the first and second electrodes RME1 and RME2 may contain layers including a transparent conductive material layer and a metal layer having high reflectivity, or may include a layer containing a transparent conductive material or a metal having high reflectivity. The first and second electrodes RME1 and RME2 may have a stacked structure of ITO/Ag/ITO, ITO/Ag/IZO, ITO/Ag/ITZO/IZO, or the like.

The first insulating layer PAS1 may be disposed on the first planarization layer OC1, the first electrode RME1, and the second electrode RME2. The first insulating layer PAS1 may protect and insulate the first electrode RME1 and the second electrode RME2 from each other. The first insulating layer PAS1 may prevent damage caused by direct contact between the light emitting element ED and the first and second electrodes RME1 and RME2 in an alignment process of the light emitting element ED.

The sub-bank SB may be disposed on the first insulating layer PAS1 in the light blocking area BA. The sub-bank SB may be disposed at the boundary portion of the pixels to distinguish the light emitting elements ED of each of the pixels. The sub-bank SB may have a specific height and may contain an organic insulating material such as polyimide (PI).

The light emitting elements ED may be arranged on the first insulating layer PAS1. The light emitting elements ED may be arranged in parallel to each other between the first electrode RME1 and the second electrodes RME2. The length of the light emitting element ED may be greater than the distance between the first electrode RME1 and the second electrodes RME2. The light emitting element ED may include semiconductor layers. For example, an end portion of the light emitting element ED may be defined with respect to the first semiconductor layer, and another end opposite to an end portion of the light emitting element ED may be defined with respect to the second semiconductor layer. An end portion of the light emitting element ED may be disposed on the first electrode RME1, and another end portion of the light emitting element ED may be disposed on the second electrode RME2. An end portion of the light emitting element ED may be connected (e.g., electrically connected) to the first electrode RME1 through the first contact electrode CTE1, and another end portion of the light emitting element ED may be connected (e.g., electrically connected) to the second electrode RME2 through the second contact electrode CTE2.

The light emitting element ED may have a micro-meter or nano-meter size, and may be an inorganic light emitting diode including an inorganic material. The light emitting element ED may be aligned between the first electrode RME1 and the second electrode RME2 facing each other by the electric field formed in a specific direction between the first electrode RME1 and the second electrode RME2.

For example, light emitting elements ED may include active layers having the same material and emit light of the same wavelength band or light of the same color. The lights emitted from the first to third emission areas LA1, LA2, and LA3 of the light emitting element layer EML may have the same color. For example, the light emitting elements ED may emit light of a third color (or blue light) having a peak wavelength in the range of about 440 nm to about 480 nm, but embodiments are not limited thereto.

The second insulating layer PAS2 may be disposed on the light emitting elements ED. For example, the second insulating layer PAS2 may partially surround the light emitting elements ED and may not cover ends (e.g., opposite ends) of the light emitting elements ED. The second insulating layer PAS2 may protect the light emitting elements ED, and may fix the light emitting elements ED in the manufacturing process of the display devices 10. The second insulating layer PAS2 may fill the space between the light emitting element ED and the first insulating layer PAS1.

The first contact electrode CTE1 may be disposed on the first insulating layer PAS1, and may be connected to the first electrode RME1, which is inserted (or disposed) into the contact hole provided in the first insulating layer PAS1. For example, the contact hole of the first insulating layer PAS1 may be disposed on the protruding pattern BP, but embodiments are not limited thereto. An end portion of the first contact electrode CTE1 may be connected to the first electrode RME1 on the protruding pattern BP, and another end portion of the first contact electrode CTE1 may be connected to an end portion of the light emitting element ED.

The second contact electrode CTE2 may be disposed on the first insulating layer PAS1, and may be connected to the second electrode RME2, which is inserted (or disposed) into the contact hole provided in the first insulating layer PAS1. For example, the contact hole of the first insulating layer PAS1 may be disposed on the protruding pattern BP, but embodiments are not limited thereto. An end portion of the second contact electrode CTE2 may be connected to another end portion of the light emitting element ED, and another end portion of the second contact electrode CTE2 may be connected to the second electrode RME2 on the protruding pattern BP.

The third insulating layer PAS3 may be disposed on the first and second contact electrodes CTE1 and CTE2, the sub-bank SB, and the first and second insulating layers PAS1 and PAS2. The third insulating layer PAS3 may be disposed at the upper end portion of the light emitting element layer EML to protect the light emitting element layer EML.

The wavelength conversion layer WLCL may be disposed on the light emitting element layer EML. The wavelength conversion layer WLCL may include a first light blocking member BK1, a first wavelength conversion member WLC1, a second wavelength conversion member WLC2, a light transmission member LTU, a second passivation layer PV2, a second planarization layer OC2, or the like.

The first light blocking member BK1 may be disposed on the third insulating layer PAS3 in the light blocking area BA. The first light blocking member BK1 may overlap the sub-bank SB in the thickness direction (e.g., Z-axis direction). The first light blocking member BK1 may block transmission of light. The first light blocking member BK1 may prevent light infiltration and color mixture between the first to third emission areas LA1, LA2, and LA3, thereby improving color reproducibility of the display devices 10. The first light blocking member BK1 may be arranged in the form of a grid surrounding the first to third emission areas LA1, LA2, and LA3 in a plan view.

The first wavelength conversion member WLC1 may be disposed on the third insulating layer PAS3 in the first emission area LA1. The first wavelength conversion member WLC1 may be surrounded by the first light blocking member BK1. The first wavelength conversion member WLC1 may change (or shift) the peak wavelength of the incident light to a first peak wavelength. The first wavelength conversion member WLC1 may include a first based resin BS1, a first scatterer SCT1, and a first wavelength shifter WLS1.

The first base resin BS1 may contain a material having a high light transmittance. The first base resin BS1 may be formed of a transparent organic material. For example, the first base resin BS1 may contain at least one of organic materials such as epoxy resin, acrylic resin, cardo resin, or imide resin.

The first scatterer SCT1 may have a refractive index different from that of the first base resin BS1 and form an optical interface with the first base resin BS1. For example, the first scatterer SCT1 may contain a light scattering material or light scattering particles that scatter at least a part of the transmitted light. For example, the first scatterer SCT1 may contain a metallic oxide such as titanium oxide ($TiO_2$), zirconium oxide ($ZrO_2$), aluminum oxide ($AL_2O_3$), indium oxide ($In_2O_3$), zinc oxide (ZnO), or tin oxide ($SnO_2$), or may contain organic particles such as acrylic resin and urethane resin. The first scatterer SCT1 may scatter light in random directions regardless of the incidence direction of the incident light without any substantial change of the peak wavelength of the incident light.

The first wavelength shifter WLS1 may change (or shift) the peak wavelength of the incident light to a first peak wavelength. For example, the first wavelength shifter WLS1 may convert blue light transmitted from the light emitting element layer EML into red light having a single peak wavelength in the range of about 610 nm to about 650 nm and emit the red light. The first wavelength shifter WLS1 may be a quantum dot, a quantum rod, or a fluorescent substance. The quantum dot may be a particulate material that emits light of a specific color in case that an electron transitions from a conduction band to a valence band.

A part of the blue light emitted from the light emitting element layer EML may pass through the first wavelength conversion member WLC1 without being converted to red light by the first wavelength shifter WLS1. Among the blue light emitted from the light emitting element layer EML, the light incident on the first color filter CF1 without being converted by the first wavelength conversion member WLC1 may be blocked by the first color filter CF1. The red light generated by the first wavelength conversion member WLC1, which converts the blue light emitted from the light emitting element layer EML, may pass through the first color filter CF1 to be emitted to the outside. Accordingly, the red light may be emitted through the first emission area LA1.

The second wavelength conversion member WLC2 may be disposed on the third insulating layer PAS3 in the second emission area LA2. The second wavelength conversion member WLC2 may be surrounded by the first light blocking member BK1. The second wavelength conversion member WLC2 may change (or shift) the peak wavelength of the incident light to a second peak wavelength. The second wavelength conversion member WLC2 may include a second base resin BS2, a second scatterer SCT2, and a second wavelength shifter WLS2.

The second base resin BS2 may contain a material having a high light transmittance. The second base resin BS2 may be formed of a transparent organic material. For example, the second base resin BS2 and the first base resin BS1 may be made of the same material. For example, the second base resin BS2 may be made of the material included in the first base resin BS1.

The second scatterer SCT2 may have a refractive index different from that of the second base resin BS2 and form an optical interface with the second base resin BS2. For example, the second scatterer SCT2 may contain a light scattering material or light scattering particles scattering at least a part of the transmitted light. For example, the second scatterer SCT2 and the first scatterer SCT1 may be made of the same material. For example, the second scatterer SCT2 may be made of the material included in the first scatterer SCT1.

The second wavelength shifter WLS2 may change (or shift) the peak wavelength of the incident light to a second peak wavelength different from the first peak wavelength of the first wavelength shifter WLS1. For example, the second wavelength shifter WLS2 may convert blue light transmitted from the light emitting element layer EML into green light having a single peak wavelength in the range of about 510 nm to about 550 nm and emit the green light. The second wavelength shifter WLS2 may be a quantum dot, a quantum rod, or a fluorescent substance. The second wavelength shifter WLS2 may contain the materials included in the first wavelength shifter WLS1. The second wavelength shifter WLS2 may be formed of a quantum dot, a quantum rod, or a fluorescent substance to have a wavelength conversion range different from that of the first wavelength shifter WLS1.

The light transmission member LTU may be disposed on the third insulating layer PAS3 in the third emission area LA3. The light transmission member LTU may be surrounded by the first light blocking member BK1. The light transmission member LTU may pass the incident light therethrough with maintaining the peak wavelength of the light. The light transmission member LTU may include a third base resin BS3 and a third scatterer SCT3.

The third base resin BS3 may contain a material having a high light transmittance. The third base resin BS3 may be formed of a transparent organic material. For example, the third base resin BS3 and the first base resin BS1 (or the second base resin BS2) may be made of the same material. For example, the third base resin BS3 may be made of the material included in the first base resin BS1.

The third scatterer SCT3 may have a refractive index different from that of the third base resin BS3 and form an optical interface with the third base resin BS3. For example, the third scatterer SCT3 may contain a light scattering material (or light scattering particles) scattering at least a part of the transmitted light. For example, the third scatterer SCT3 and the first scatterer SCT1 (or the second scatterer SCT2) may be formed of the same material. For example, the third scatterer SCT3 may be made of the material included in the first scatterer SCT1.

Since the wavelength conversion layer WLCL is disposed (e.g., directly disposed) on the third insulating layer PAS3 of the light emitting element layer EML, each display device 10 may not require a separate substrate for the first and second wavelength conversion members WLC1 and WLC2 and the light transmission member LTU. Accordingly, the first and second wavelength conversion members WLC1 and WLC2 and the light transmission member LTU may be readily aligned in the first to third emission areas LA1, LA2, and LA3, respectively, and the thickness of each display device 10 may be reduced.

The second passivation layer PV2 may cover the first and second wavelength conversion members WLC1 and WLC2, the light transmission member LTU, and the first light blocking member BK1. For example, the second passivation layer PV2 may seal (or encapsulate) the first and second wavelength conversion members WLC1 and WLC2 and the light transmission member LTU, thereby protecting the first and second wavelength conversion members WLC1 and WLC2 and the light transmission member LTU from damage or contamination. For example, the second passivation layer PV2 may contain an inorganic material.

The second planarization layer OC2 may be disposed on the second passivation layer PV2 to flatten the upper end portions of the first and second wavelength conversion members WLC1 and WLC2 and the light transmission member LTU. For example, the second planarization layer OC2 may contain an organic insulating material such as polyimide (PI).

The color filter layer CFL may be disposed on the wavelength conversion layer WLCL. The color filter layer CFL may include a second light blocking member BK2, first to third color filters CF1, CF2, and CF3, and a third passivation layer PV3.

The second light blocking member BK2 may be disposed on the second planarization layer OC2 of the wavelength conversion layer WLCL in the light blocking area BA. The second light blocking member BK2 may overlap the first light blocking member BK1 or the sub-bank SB in the thickness direction (e.g., Z-axis direction). The second light blocking member BK2 may block transmission of light. The second light blocking member BK2 may prevent light infiltration and color mixture between the first to third emission areas LA1, LA2, and LA3, thereby improving color reproducibility of the display devices 10. The second light blocking member BK2 may be arranged in the form of a grid surrounding the first to third emission areas LA1, LA2, and LA3 in a plan view.

The first color filter CF1 may be disposed on the second planarization layer OC2 in the first emission area LA1. The first color filter CF1 may be surrounded by the second light blocking member BK2. The first color filter CF1 may overlap the first wavelength conversion member WLC1 in the thickness direction (e.g., Z-axis direction). The first color filter CF1 may selectively pass (or transmit) the first color light (e.g., red light) therethrough, and block (or absorb) the second color light (e.g., green light) and the third color light (e.g., blue light). For example, the first color filter CF1 may be a red color filter and contain a red colorant.

The second color filter CF2 may be disposed on the second planarization layer OC2 in the second emission area LA2. The second color filter CF2 may be surrounded by the second light blocking member BK2. The second color filter CF2 may overlap the second wavelength conversion member WLC2 in the thickness direction (e.g., Z-axis direction). The second color filter CF2 may selectively pass (or transmit) the second color light (e.g., green light) therethrough, and block (or absorb) the first color light (e.g., red light) and the third color light (e.g., blue light). For example, the second color filter CF2 may be a green color filter and contain a green colorant.

The third color filter CF3 may be disposed on the second planarization layer OC2 in the third emission area LA3. The third color filter CF3 may be surrounded by the second light blocking member BK2. The third color filter CF3 may overlap the light transmission member LTU in the thickness direction (e.g., Z-axis direction). The third color filter CF3 may selectively pass (or transmit) the third color light (e.g., blue light) therethrough, and block (or absorb) the first color light (e.g., red light) and the second color light (e.g., green light). For example, the third color filter CF3 may be a blue color filter and contain a blue colorant.

The first to third color filters CF1, CF2, and CF3 may absorb a part of the light transmitting from the outside of the display devices 10 to reduce (or minimize) the reflection of the external light. Thus, the first to third color filters CF1, CF2, and CF3 may prevent color distortion caused by the reflection of the external light.

Since the first to third color filters CF1, CF2, and CF3 are disposed (e.g., directly disposed) on the second planarization layer OC2 of the wavelength conversion layer WLCL, each display device 10 may not require a separate substrate for the first to third color filters CF1, CF2, and CF3. Therefore, the thickness of each display device 10 may be reduced.

The third passivation layer PV3 may cover the first to third color filters CF1, CF2, and CF3, and the second light blocking member BK2. The third passivation layer PV3 may protect the first to third color filters CF1, CF2, and CF3.

The encapsulation layer TFE may be disposed on the third passivation layer PV3 of the color filter layer CFL. The encapsulation layer TFE may cover the top and side surfaces of the display layer DPL. For example, the encapsulation layer TFE may include at least one inorganic layer to prevent permeation of oxygen or moisture. For example, the encapsulation layer TFE may include at least one organic layer to protect the display devices 10 from foreign substances such as dust.

The anti-reflection film ARF may be disposed on the encapsulation layer TFE. The anti-reflection film ARF may prevent reflection of external light, thereby reducing a decrease in visibility due to reflection of external light. The anti-reflection film ARF may protect the top surface (or the upper surface) of each display device 10. In another example, the anti-reflection film ARF may be omitted. In the other example, the anti-reflection film ARF may be replaced with a polarizing film.

The flexible film FPCB may be disposed under the first substrate SUB1. The flexible film FPCB may be disposed on an edge portion of the bottom surface (or the lower surface) of each display device 10. The flexible film FPCB may be attached (or coupled) to the bottom surface (or the lower surface) of the first substrate SUB1 by using the adhesive member ADM. The flexible film FPCB may include the lead electrode LDE disposed on the top surface (or the upper surface) of a side. The lead electrode LDE may be inserted (or disposed) into the first contact hole CNT1 to be connected (e.g., electrically connected) to the pad part PAD through the connection film ACF. The flexible film FPCB may support the display driver DIC disposed on the bottom surface (or the lower surface) on another side. The lead electrode LDE may be connected (e.g., electrically connected) to the display driver DIC through a lead line disposed on the bottom surface (or the lower surface) of the flexible film FPCB. Another side of the flexible film FPCB may be connected to a source circuit board under the first substrate SUB1. The flexible film FPCB may transmit a signal and a voltage of the display driver DIC to each display device 10.

The connection film ACF may attach (or couple) the lead electrode LDE of the flexible film FPCB to the pad part PAD. A surface of the connection film ACF may be attached (or coupled) to the pad part PAD, and another surface of the connection film ACF may be attached (or coupled) to the lead electrode LDE. For example, the connection film ACF may include an anisotropic conductive film. In case that the connection film ACF includes the anisotropic conductive film, the connection film ACF may have conductivity in an area in which the pad part PAD and the lead electrode LDE are in contact with each other, and may connect (e.g., electrically connect) the flexible film FPCB to the fan-out line FOL.

The display driver DIC may be mounted on the flexible film FPCB. The display driver DIC may be an integrated circuit (IC). The display driver DIC may convert digital video data into an analog data voltage based on the data control signal received from a timing controller, and supply the analog data voltage to the data line of the display area DA through the flexible film FPCB. The display driver DIC may supply the power voltage received from a power supply unit to the power line of the display area DA through the flexible film FPCB. The display driver DIC may generate gate signals based on the gate control signal, and may sequentially supply the gate signals to the gate lines according to a set order. Each display device 10 may include the fan-out line FOL disposed on the first substrate SUB1 and the display driver DIC disposed under the first substrate SUB1, so that the area of the non-display area NDA may be minimized.

Figure 3:
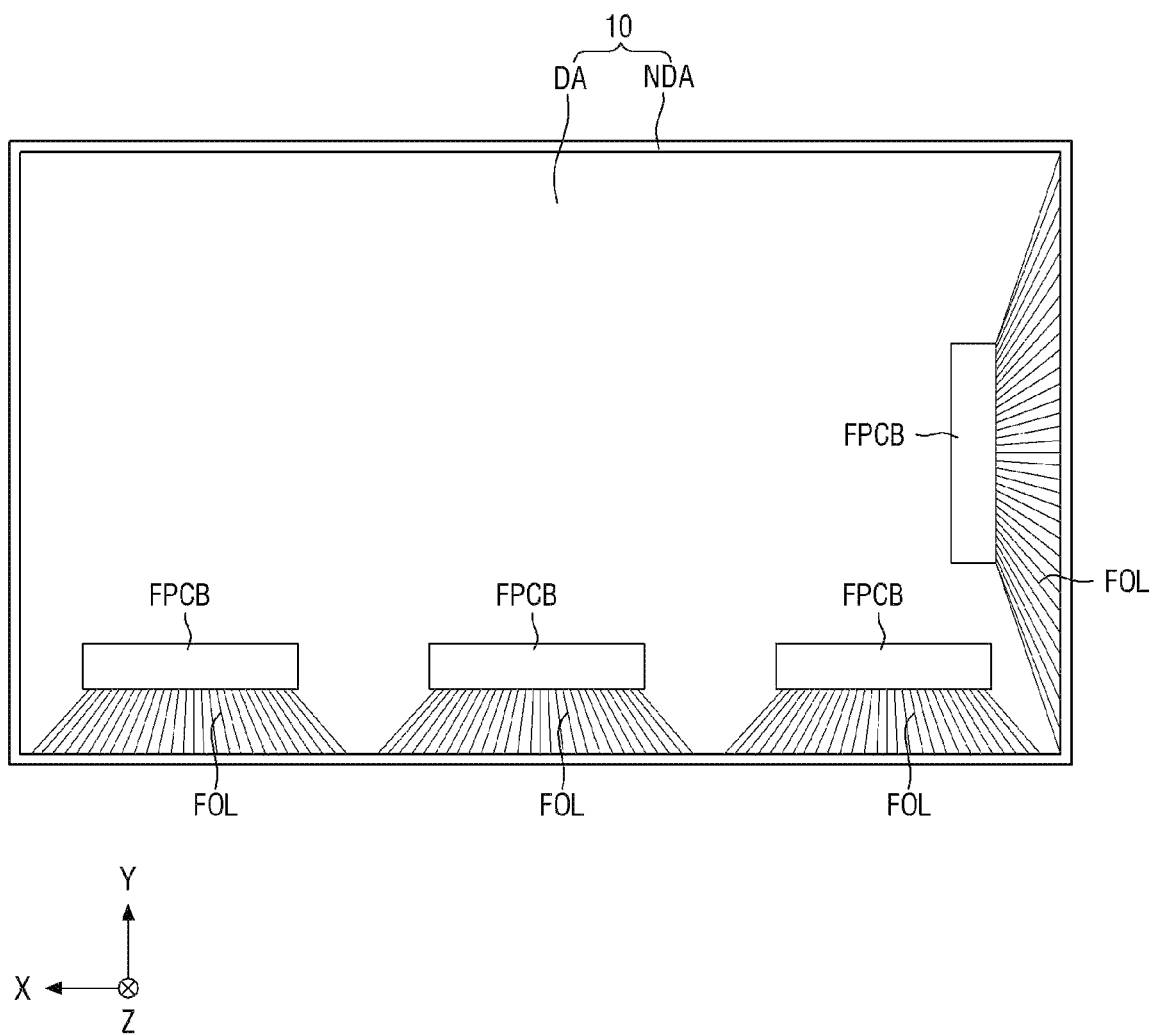
FIG. 3 is a schematic bottom view illustrating the display device according to an embodiment.
Figure 4:
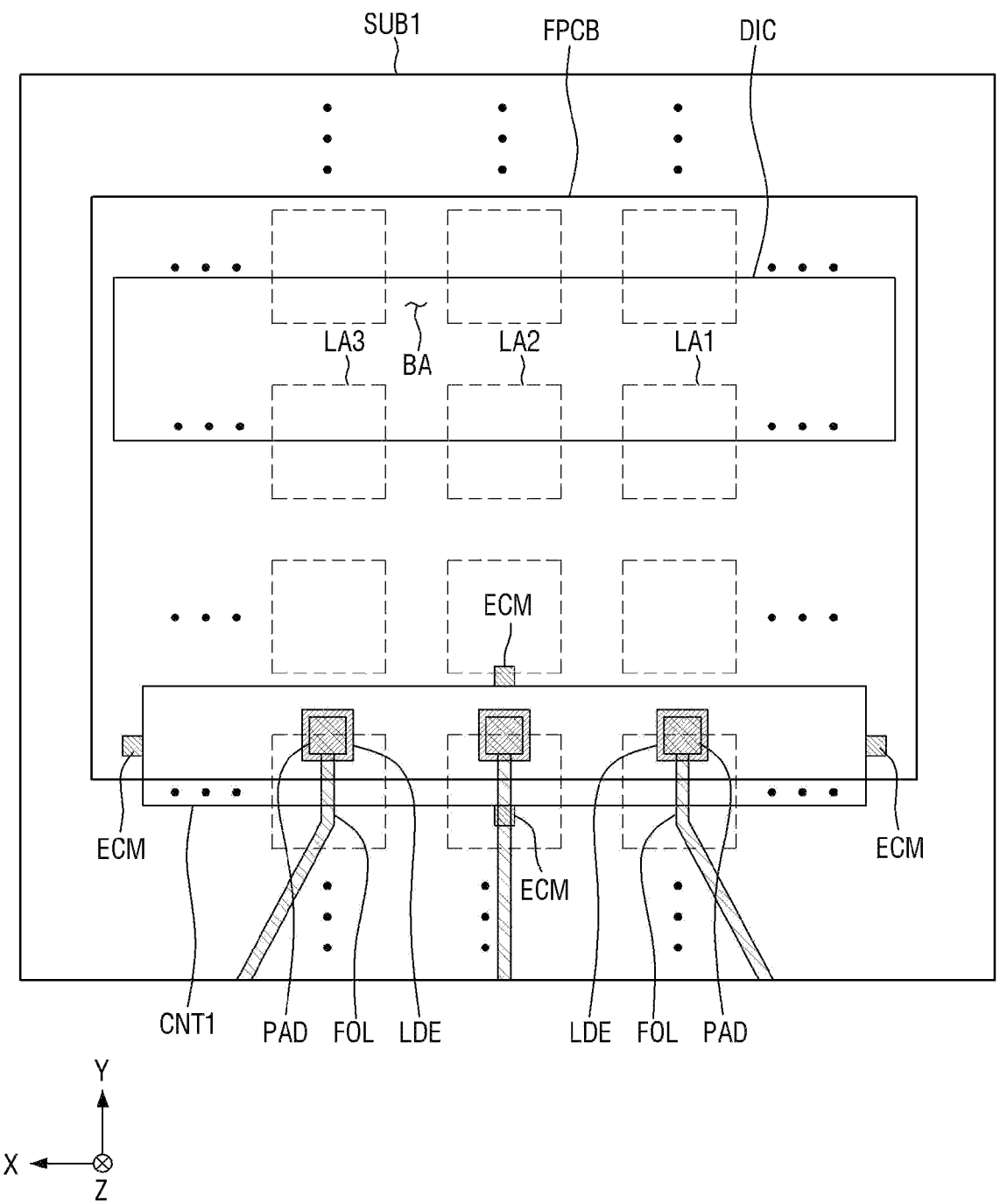
FIG. 4 is a schematic enlarged bottom view illustrating a part of the display device according to an embodiment.

FIG. 3 is a schematic bottom view illustrating each display device 10 according to an embodiment, and FIG. 4 is a schematic enlarged bottom view illustrating a part of the display device according to an embodiment.

Referring to FIGS. 3 and 4, the flexible film FPCB, the pad part PAD, and the fan-out line FOL may be disposed in the display area DA.

The flexible film FPCB may be disposed under the first substrate SUB1. The flexible film FPCB may be disposed on an edge portion of the bottom surface (or the lower surface) of each display device 10. For example, a portion of the flexible film FPCB may be disposed on the edge portion of the long side of each display device 10, and another portion of the flexible film FPCB may be disposed on the edge portion of the short side of each display device 10. The flexible film FPCB disposed at the edge portion of the long side of the display device 10 may supply a data voltage and a power voltage, the flexible film FPCB disposed at the edge portion of the short side of each display device 10 may supply a gate signal, but embodiments are not limited thereto.

The flexible film FPCB may include the lead electrode LDE. Each of the pad parts PAD may correspond to each of the lead electrodes LDE. The lead electrode LDE may be connected (e.g., electrically connected) to the pad part PAD through the connection film ACF.

The pad part PAD may be inserted (or disposed) into the second contact hole CNT2 of the second barrier insulating layer BIL2 and may be exposed through the first contact hole CNT1. The pad parts PAD disposed at the edge portion of the long side of each display device 10 may be arranged in the first direction (e.g., X-axis direction). The pad parts PAD disposed at the edge portion of the short side of each display device 10 may be arranged in the second direction (e.g., Y-axis direction).

The fan-out line FOL may be integral with the pad part PAD. The fan-out line FOL may extend from the pad part PAD to an edge portion of each display device 10. For example, the fan-out line FOL disposed at the edge portion of the long side of each display device 10 may extend in a direction opposite to the second direction (e.g., Y-axis direction) of the flexible film FPCB. The fan-out line FOL disposed on the edge portion of the short side of each display device 10 may extend in a direction opposite to the first direction (e.g., X-axis direction) of the flexible film FPCB. The fan-out line FOL may be connected (e.g., electrically connected) to a data line or a gate line of the display area DA through the connection part CWL.

The etching mark ECM may be adjacent to the first contact hole CNT1. The etching mark ECM may be disposed on at least one side of the sides of the first contact hole CNT1. The etching mark ECM may be formed by removing a part of the first metal layer MTL1 during the formation of the first contact hole CNT1. The etching mark ECM may function as an alignment mark that determines a planar shape of the first contact hole CNT1. The etching mark ECM may control an etching depth in an etching process of the first substrate SUB1. The etching mark ECM may improve process precision during the formation of the first contact hole CNT1.

Figure 5:
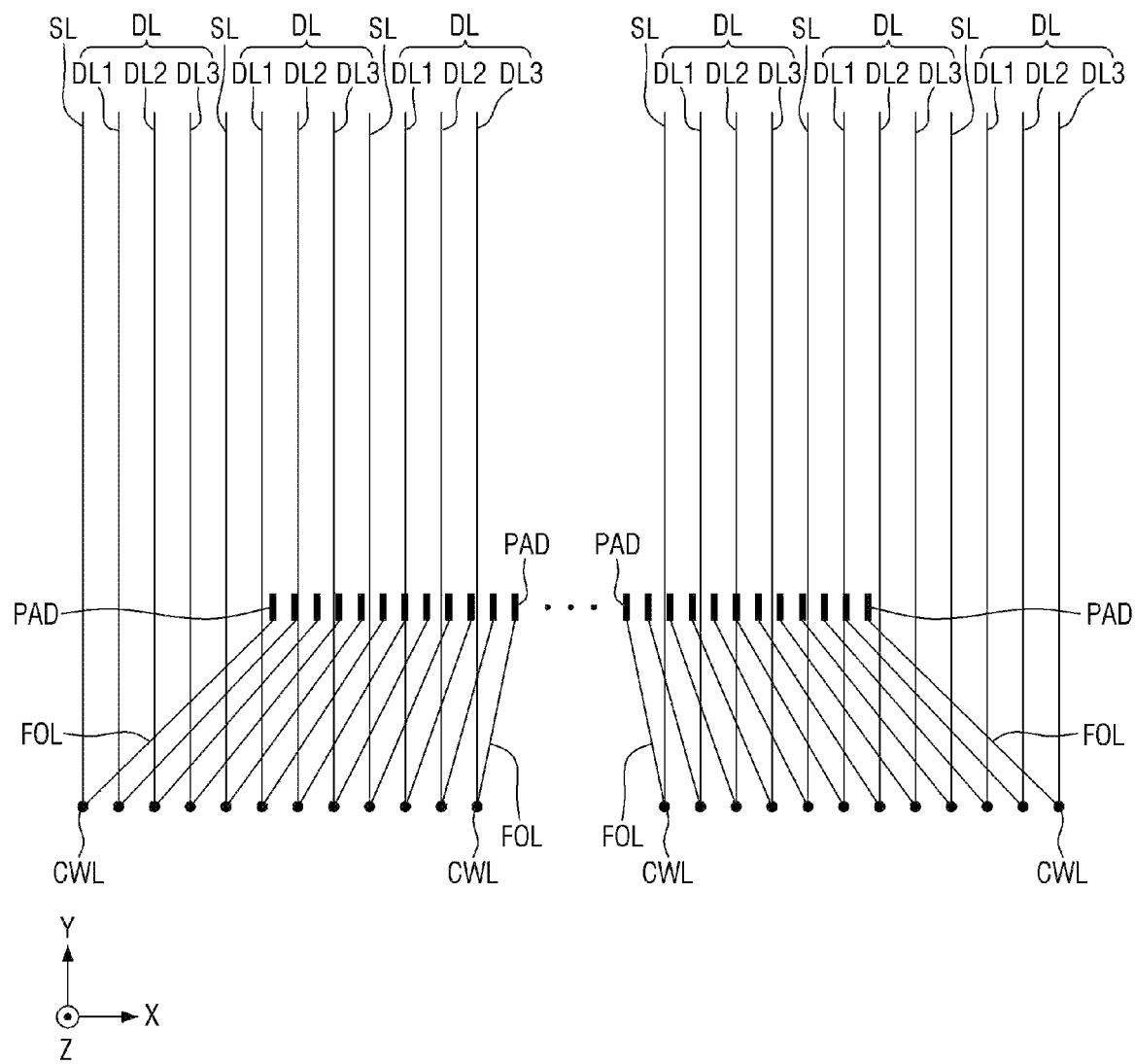
FIG. 5 is a schematic view illustrating a pad part, a fan-out line, a sensing line, and a data line in a display device according to an embodiment.
Figure 6:
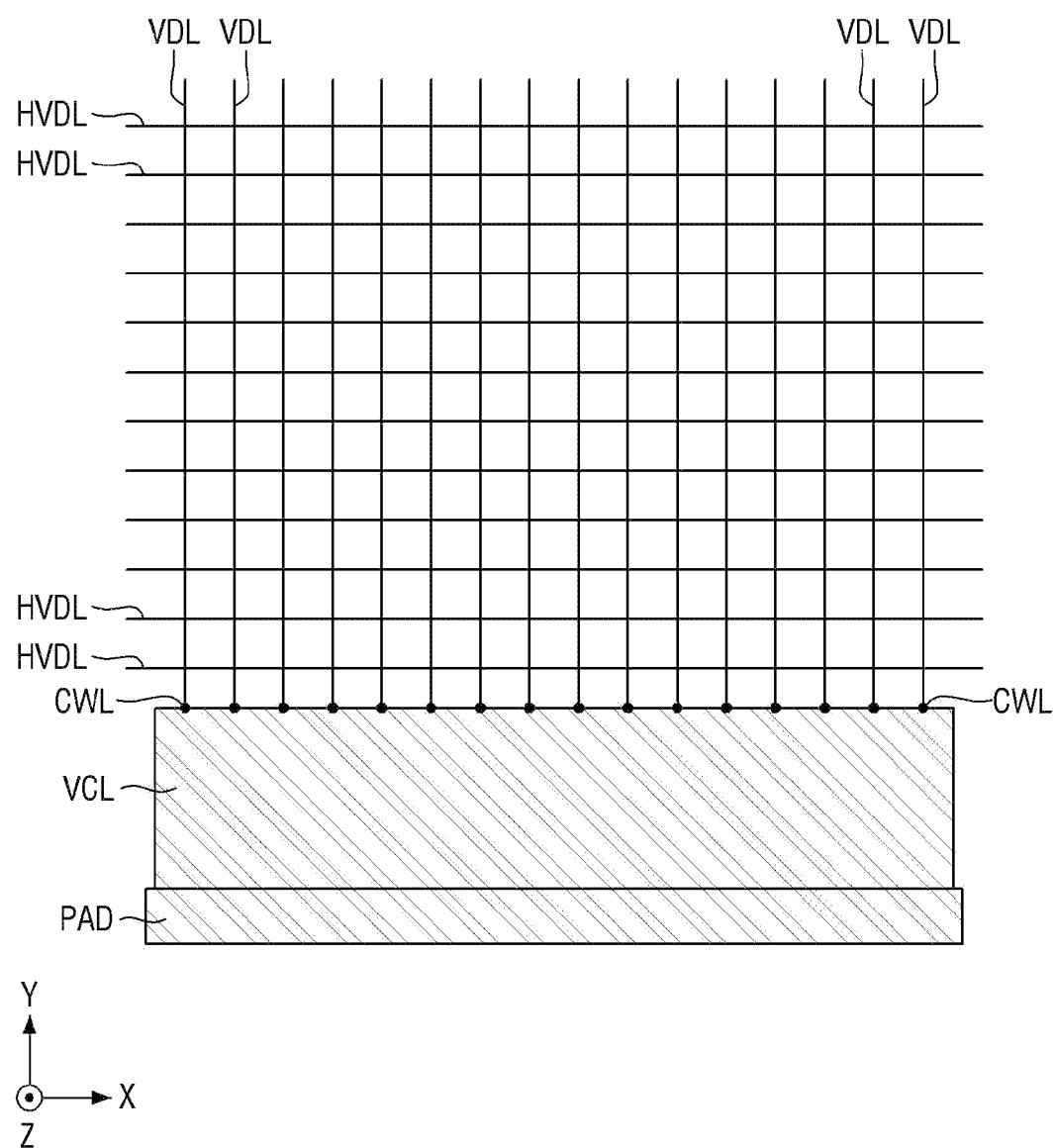
FIG. 6 is a schematic view illustrating a pad part, a power connection line, a high potential line, and a horizontal voltage line in a display device according to an embodiment.
Figure 7:
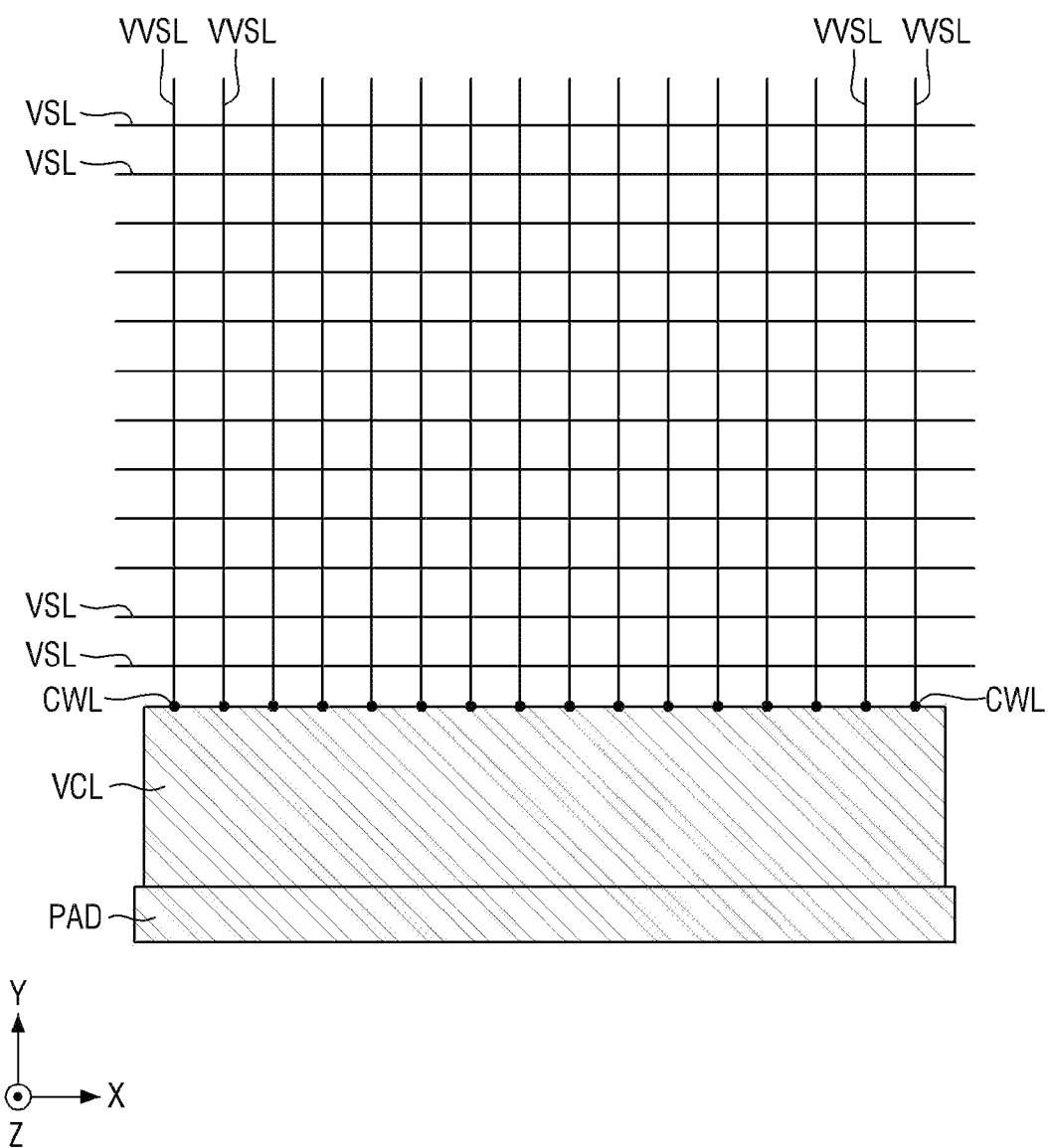
FIG. 7 is a schematic view illustrating a pad part, a power connection line, a low potential line, and a vertical voltage line in a display device according to an embodiment.
Figure 8:
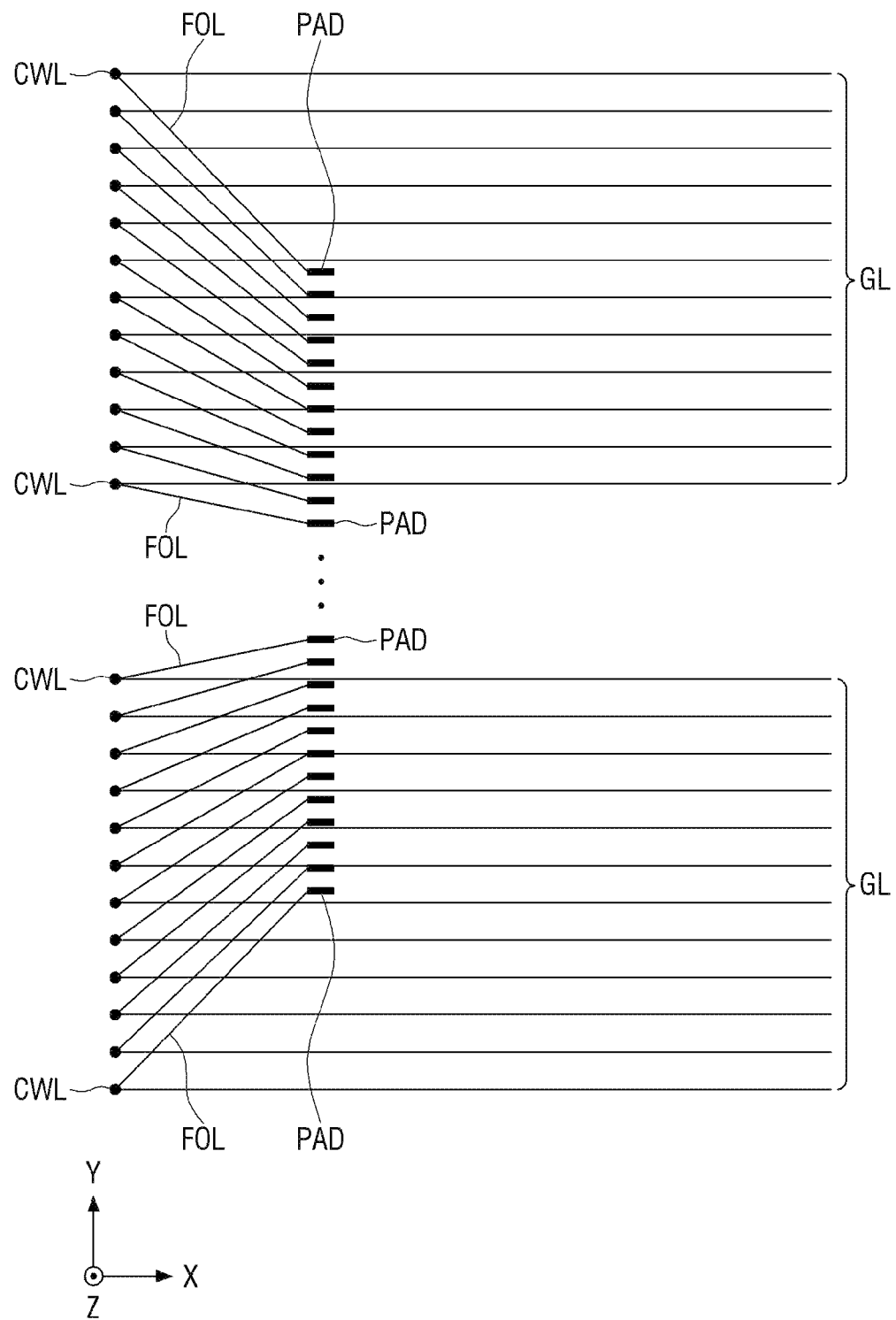
FIG. 8 is a schematic view illustrating a pad part, a fan-out line, and a gate line in the display device according to an embodiment.

FIG. 5 is a schematic view illustrating a pad part, a fan-out line, a sensing line, and a data line in a display device according to an embodiment, and FIG. 6 is a schematic view illustrating a pad part, a power connection line, a high potential line, and a horizontal voltage line in a display device according to an embodiment. FIG. 7 is a schematic view illustrating a pad part, a power connection line, a low potential line, and a vertical voltage line in a display device according to an embodiment, and FIG. 8 is a schematic view illustrating a pad part, a fan-out line, and a gate line in the display device according to an embodiment.

Referring to FIGS. 5 to 8, the display area DA may include a sensing line SL, a data line DL, a high potential line VDL, a horizontal voltage line HVDL, a low potential line VSL, a vertical voltage line VVSL, and a gate line GL.

The sensing lines SL may extend in the second direction (e.g., Y-axis direction) and may be spaced apart from each other in the first direction (e.g., X-axis direction). Referring to FIG. 2, the sensing line SL may be disposed in the third metal layer MTL3 to extend in the second direction (e.g., Y-axis direction). The sensing line SL may be connected (e.g., electrically connected) to the fan-out line FOL of the second metal layer MTL2 through the connection part CWL. The sensing line SL may cross the fan-out line FOL in a plan view. The sensing line SL may receive an initialization voltage through the pad part DPD. The sensing line SL may provide (or transfer) a sensing signal to the pad part DPD.

The data lines DL may include first to third data lines DL1, DL2, and DL3. The first to third data lines DL1, DL2, and DL3 may extend in the second direction (e.g., Y-axis direction) and may be spaced apart from each other in the first direction (e.g., X-axis direction). Referring to FIG. 2, the data line DL may be disposed (or included) in the third metal layer MTL3 to extend in the second direction (e.g., Y-axis direction). The data line DL may be connected (e.g., electrically connected) to the fan-out line FOL of the second metal layer MTL2 through the connection part CWL. The data line DL may cross the fan-out line FOL in a plan view. The data line DL may receive a data voltage through the pad part DPD.

High potential lines VDL may extend in the second direction (e.g., Y-axis direction) and may be spaced apart from each other in the first direction (e.g., X-axis direction). The high potential lines VDL may be connected to the crossing horizontal voltage lines HVDL, and may supply a high potential voltage to the horizontal voltage lines HVDL. Referring to FIG. 2, the high potential line VDL may be disposed (or included) in the third metal layer MTL3 to extend in the second direction (e.g., Y-axis direction). The high potential line VDL may be connected (e.g., electrically connected) to the power connection line VCL of the second metal layer MTL2 through the connection part CWL. The high potential line VDL may receive a high potential voltage through the pad part PAD.

The horizontal voltage lines HVDL may extend in the first direction (e.g., X-axis direction) and may be spaced apart from each other in the second direction (e.g., Y-axis direction). The horizontal voltage lines HVDL may be connected to the crossing high potential lines VDL, and may receive a high potential voltage from the high potential lines VDL. Referring to FIG. 2, the horizontal voltage line HVDL may be disposed (or included) in the fifth metal layer MTL5 to extend in the first direction (e.g., X-axis direction).

The vertical voltage lines VVSL may extend in the second direction (e.g., Y-axis direction) and may be spaced apart from each other in the first direction (e.g., X-axis direction). The vertical voltage lines VVSL may be connected to the crossing low potential lines VSL, and may supply a low potential voltage to the low potential lines VSL. Referring to FIG. 2, the vertical voltage line VVSL may be disposed (or included) in the third metal layer MTL3 to extend in the second direction (e.g., Y-axis direction). The vertical voltage line VVSL may be connected (e.g., electrically connected) to the power connection line VCL of the second metal layer MTL2 through the connection part CWL. The vertical voltage line VVSL may receive a low potential voltage through the pad part PAD.

The low potential lines VSL may extend in the first direction (e.g., X-axis direction) and may be spaced apart from each other in the second direction (e.g., Y-axis direction). The low potential lines VSL may be connected to the crossing vertical voltage lines VVSL, and may receive a low potential voltage from the vertical voltage lines VVSL. Referring to FIG. 2, the low potential line VSL may be disposed (or included) in the fifth metal layer MTL5 to extend in the first direction (e.g., X-axis direction).

The gate lines GL may extend in the first direction (e.g., X-axis direction) and may be spaced apart from each other in the second direction (e.g., Y-axis direction). Referring to FIG. 2, the gate line GL may be disposed (or included) in the fourth metal layer MTL4 or the fifth metal layer MTL5 to extend in the first direction (e.g., X-axis direction). The gate line GL may be connected (e.g., electrically connected) to the fan-out line FOL of the second metal layer MTL2 through the connection part CWL. The gate line GL may cross the fan-out line FOL in a plan view. The gate line GL may receive a gate signal through the pad part PAD.

Figure 9:
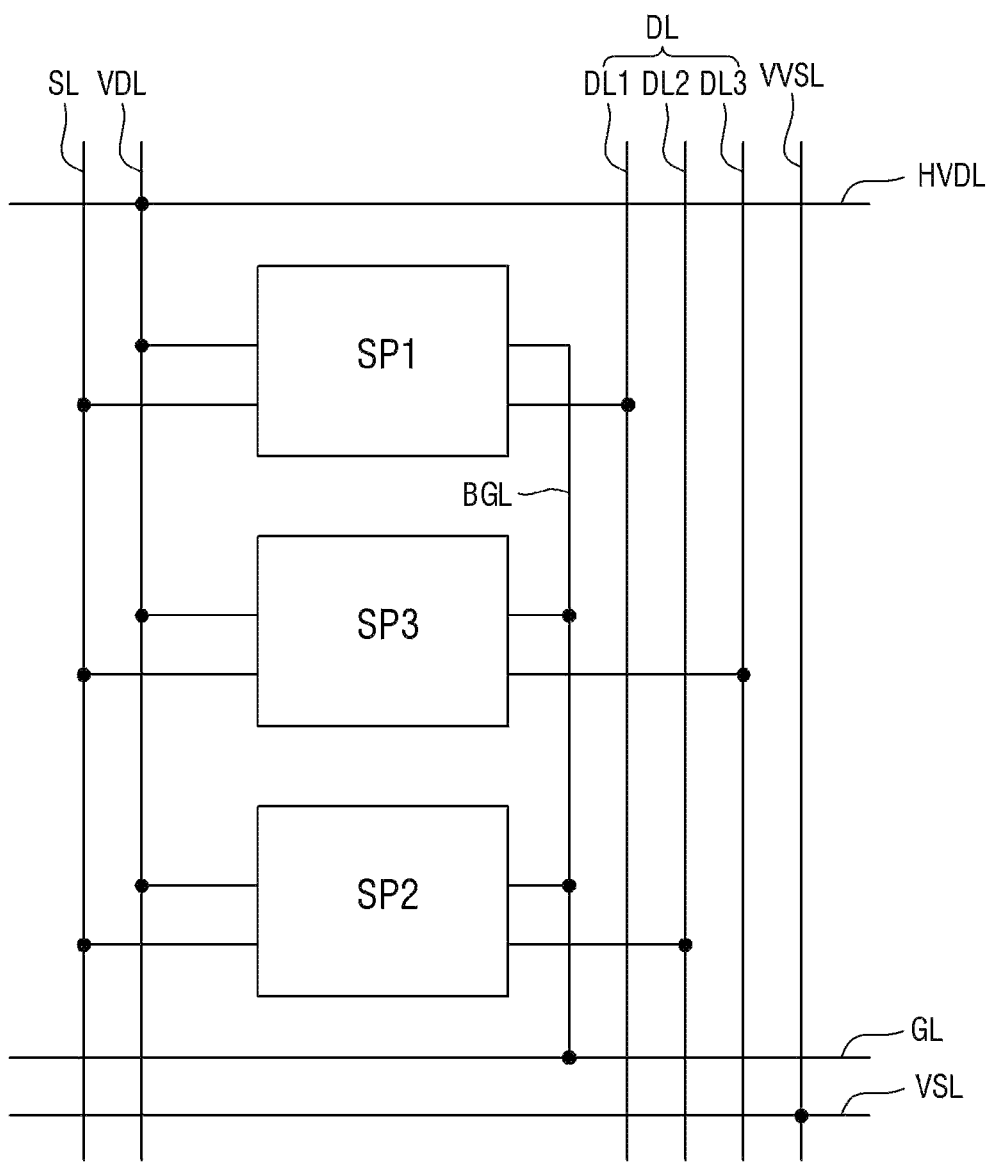
FIG. 9 is a block diagram illustrating pixels and lines of a display device according to an embodiment.
Figure 10:
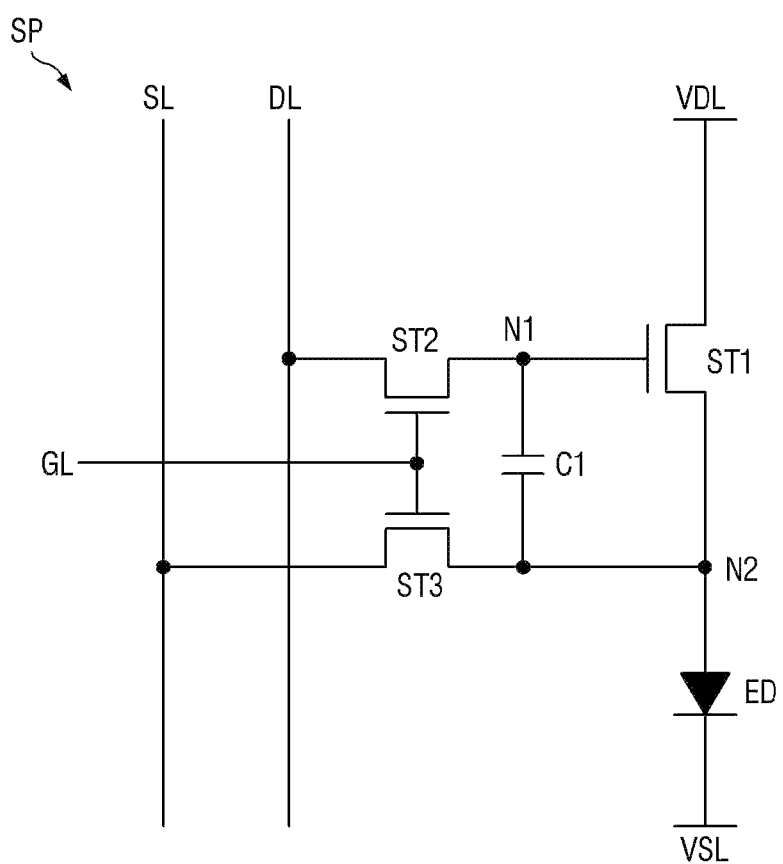
FIG. 10 is a schematic diagram of an equivalent circuit of the pixel of FIG. 9.

FIG. 9 is a block diagram illustrating pixels and lines of a display device according to an embodiment, and FIG. 10 is a schematic diagram of an equivalent circuit of the pixel of FIG. 9.

Referring to FIGS. 9 to 10, the pixels SP may include first to third pixels SP1, SP2, and SP3. The pixel circuits of the first pixel SP1, the third pixel SP3 and the second pixel SP2 may be arranged in the opposite direction of the second direction (e.g., Y-axis direction), but the arrangement direction of the pixel circuits is not limited thereto.

Each of the first to third pixels SP1, SP2, and SP3 may be connected to the high potential line VDL, the sensing line SL, the gate line GL, and the data line DL.

The high potential line VDL may extend in the second direction (e.g., Y-axis direction). The high potential line VDL may be disposed on (or adjacent to) the left sides of the pixel circuits of the first to third pixels SP1, SP2 and SP3. The high potential line VDL may supply a high potential voltage to a transistor of each of the first to third pixels SP1, SP2 and SP3.

The horizontal voltage line HVDL may extend in the first direction (e.g., X-axis direction). The horizontal voltage line HVDL may be disposed on (or adjacent to) the upper side of the pixel circuit of the first pixel SP1. The horizontal voltage line HVDL may be connected to the high potential line VDL. The horizontal voltage line HVDL may receive a high potential voltage from the high potential line VDL.

A sensing line SL may extend in the second direction (e.g., Y-axis direction). The sensing line SL may be disposed on (or adjacent to) the left side of the high potential line VDL. The sensing line SL may supply an initialization voltage to the pixel circuit of each of the first to third pixels SP1, SP2, and SP3. The sensing line SL may receive a sensing signal from the pixel circuit of each of the first to third pixels SP1, SP2 and SP3 to supply the sensing signal the display driver DIC.

A gate line GL may extend in the first direction (e.g., X-axis direction). Referring to FIG. 2, the gate line GL may be disposed (or included) in the fourth metal layer MTL4 or the fifth metal layer MTL5. The gate line GL may be disposed on (or adjacent to) the lower side of the pixel circuit of the second pixel SP2. The gate line GL may be disposed on (or adjacent to) the upper side of the low potential line VSL. The gate line GL may supply a gate signal to the auxiliary gate line BGL.

The auxiliary gate line BGL may extend from the gate line GL in the second direction (e.g., Y-axis direction). Referring to FIG. 2, the auxiliary gate line BGL may be disposed (or included) in the fourth metal layer MTL4. A portion of the auxiliary gate line BGL may be the gate electrode GE of the second transistor ST2, and the other portion of the auxiliary gate line BGL may be the gate electrode GE of the third transistor ST3. The auxiliary gate line BGL may be disposed on (or adjacent to) the right sides of the pixel circuits of the first to third pixels SP1, SP2 and SP3. The auxiliary gate line BGL may supply the gate signals received from the gate line GL to the pixel circuits of the first to third pixels SP1, SP2 and SP3.

The data line DL may extend in the second direction (e.g., Y-axis direction). The data line DL may supply a data voltage to the pixel SP. The data lines DL may include first to third data lines DL1, DL2, and DL3.

The first data line DL1 may extend in the second direction (e.g., Y-axis direction). The first data line DL1 may be disposed on (or adjacent to) the right side of the auxiliary gate line BGL. The first data line DL1 may supply the data voltage received from the display driver DIC to the pixel circuit of the first pixel SP1.

The second data line DL2 may extend in the second direction (e.g., Y-axis direction). The second data line DL2 may be disposed on (or adjacent to) the right side of the first data line DL1. The second data line DL2 may supply the data voltage received from the display driver DIC to the pixel circuit of the second pixel SP2.

The third data line DL3 may extend in the second direction (e.g., Y-axis direction). The third data line DL3 may be disposed on (or adjacent to) the right side of the second data line DL2. The third data line DL3 may supply the data voltage received from the display driver DIC to the pixel circuit of the third pixel SP3.

The vertical voltage line VVSL may extend in the second direction (e.g., Y-axis direction). The vertical voltage line VVSL may be disposed on (or adjacent to) the right side of the third data line DL3. The vertical voltage line VVSL may be connected to the low potential line VSL and may supply a low potential voltage to the low potential line VSL.

The low potential line VSL may extend in the first direction (e.g., X-axis direction). The low potential line VSL may be disposed on (or adjacent to) the lower side of the gate line GL. The low potential line VSL may supply the low potential voltage received from the vertical voltage line VVSL to the light emitting element ED of the first to third pixels SP1, SP2, and SP3.

Each of the first to third pixels SP1, SP2, and SP3 may include a pixel circuit and the light emitting element ED. A pixel circuit of each of the first to third pixels SP1, SP2, and SP3 may include the first to third transistors ST1, ST2, and ST3 and a first capacitor C1.

The first transistor ST1 may include a gate electrode, a drain electrode, and a source electrode. The gate electrode of the first transistor ST1 may be connected to a first node N1, the drain electrode of the first transistor ST1 may be connected to the high potential line VDL, and the source electrode of the first transistor ST1 may be connected to a second node N2. The first transistor ST1 may control a drain-source current (or driving current) based on a data voltage applied to the gate electrode.

The light emitting element ED may include at least one light emitting element ED. In case that the light emitting element ED includes the light emitting elements ED, the light emitting elements ED may be connected in series or in parallel. The light emitting element ED may receive a driving current from the first transistor ST1 to emit light. The light emission amount or the luminance of the light emitting element ED may be proportional to the magnitude (or amount) of the driving current. The light emitting element ED may be an inorganic light emitting element including an inorganic semiconductor, but embodiments are not limited thereto.

The first electrode of the light emitting element ED may be connected to the second node N2, and the second electrode of the light emitting element ED may be connected to the low potential line VSL. The first electrode of the light emitting element ED may be connected to the source electrode of the first transistor ST1, the drain electrode of the third transistor ST3, and the second capacitor electrode of the first capacitor C1, through the second node N2.

The second transistor ST2 may be turned on by the gate signal of the gate line GL to connect (e.g., electrically connect) the data line DL to the first node N1 which is the gate electrode of the first transistor ST1. The second transistor ST2 may be turned on according to the gate signal to supply the data voltage to the first node N1. The gate electrode of the second transistor ST2 may be connected to the gate line GL, the drain electrode the second transistor ST2 may be connected to the data line DL, and the source electrode the second transistor ST2 may be connected to the first node N1.

The third transistor ST3 may be turned on by the gate signal of the gate line GL to connect (e.g., electrically connect) the sensing line SL to the second node N2 which is the source electrode of the first transistor ST1. The third transistor ST3 may supply the initialization voltage to the second node N2 by being turned on based on the gate signal, and may supply the sensing signal to the sensing line SL. A gate electrode of the third transistor ST3 may be connected to the gate line GL, a drain electrode the third transistor ST3 may be connected to the second node N2, and a source electrode the third transistor ST3 may be connected to the sensing line SL.

Figure 11:
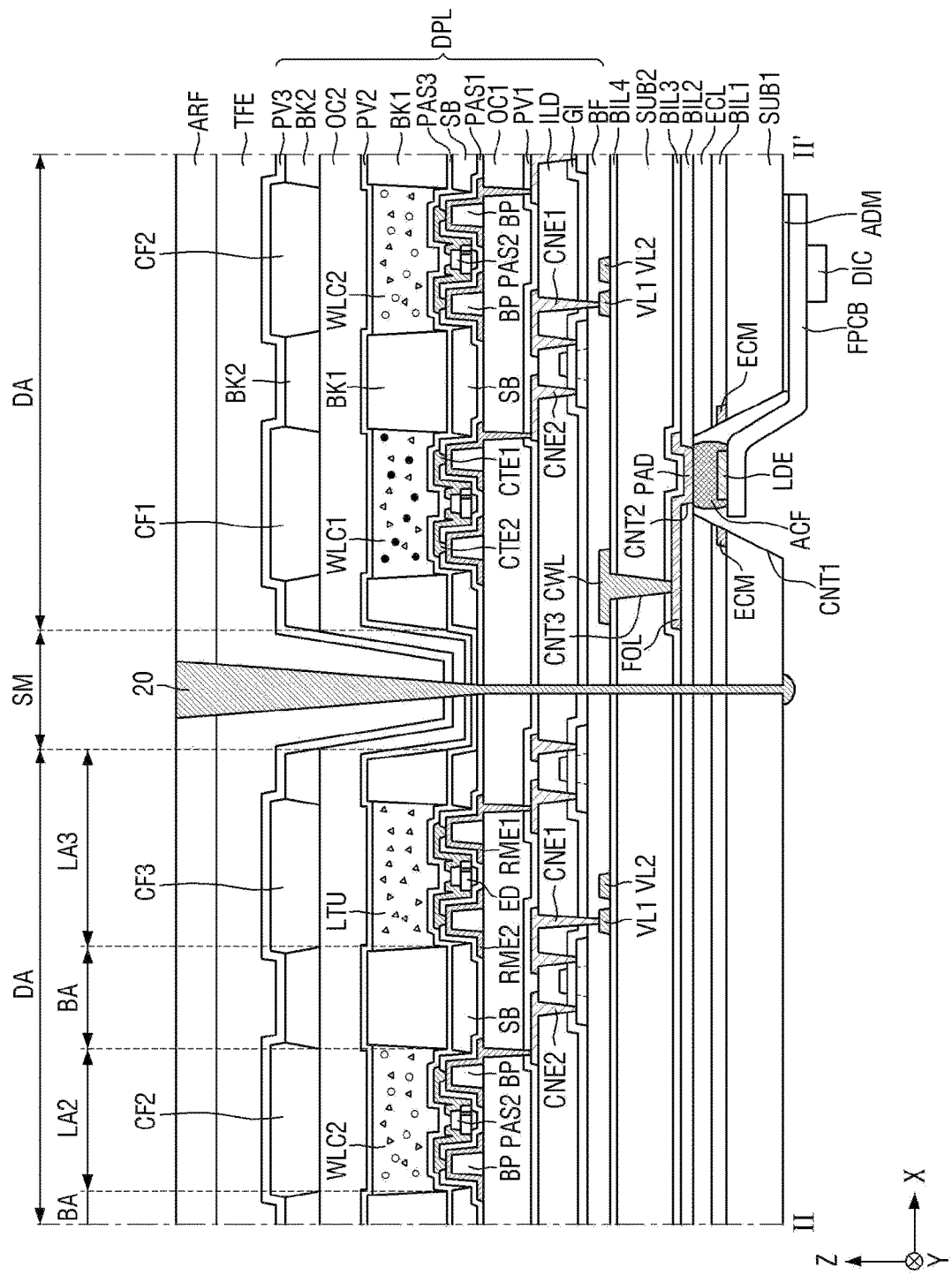
FIG. 11 is a schematic cross-sectional view taken along line II-II' of FIG. 1.

FIG. 11 is a schematic cross-sectional view taken along line II-II' of FIG. 1.

Referring to FIG. 11, the tiled display device TD may include the display devices 10 and a bonding member 20. The tiled display device TD may include first to fourth display devices 10-1, 10-2, 10-3, and 10-4. The number and connection relationship of the display devices 10 are not limited to the embodiment of FIG. 1. The number of the display devices 10 may be determined according to the size of each of the display devices 10 and the tiled display device TD.

Each of the display devices 10 may include a display area DA and a non-display area NDA. The display area DA may include pixels SP to display an image. The non-display area NDA may be disposed around the display area DA to surround the display area DA, and may not display an image.

The tiled display device TD may include a coupling area SM disposed between display areas DA. The tiled display device TD may be formed by connecting non-display areas NDA of the adjacent display devices 10. The display devices 10 (e.g., 10-1, 10-2, 10-3, and 10-4) may be connected to each other through the bonding member 20 or an adhesive member disposed in the coupling area SM. The coupling area SM of each of the display devices 10 may not include a pad member or a fan-out line connected to the pad member. Accordingly, the distance between the display areas DA of the display devices 10 may be small such that the coupling area SM may not be recognized by the user. Further, the reflectance of external light of the display areas DA of the display devices 10 may be substantially the same as that of the coupling area SM. Accordingly, in the tiled display device TD, the coupling area SM between the display devices 10 may be prevented from being recognized by the user, thereby reducing a sense of disconnection between the display devices 10 and improving a sense of immersion in an image.

The tiled display device TD may bond the side surfaces of the adjacent display devices 10 to each other by using the bonding member 20 disposed between the display devices 10. The bonding member 20 may connect the side surfaces of the first to fourth display devices 10-1, 10-2, 10-3, and 10-4 arranged in a grid form to implement the tiled display device TD. The bonding member 20 may bond a side surface of the first substrate SUB1 of the display devices 10 adjacent to each other, a side surface of the first barrier insulating layer BIL1 a side surface of the etching control layer ECL, side surfaces of the second and third barrier insulating layers BIL2 and BIL3, a side surface of the second substrate SUB2, a side surface of the fourth barrier insulating layer BIL4, a side surface of the display layer DPL, a side surface of the encapsulation layer TFE, and a side surface of the anti-reflection film ARF.

For example, the bonding member 20 may be made of an adhesive tape or a double-sided tape having a thin thickness to minimize the gap between the display devices 10. For another example, the bonding member 20 may be formed of a bonding frame having a thin thickness to minimize the gap between the display devices 10. Accordingly, in the tiled display device TD, it is possible to prevent the user from recognizing the coupling area SM between the display devices 10.

FIGS. 12 to 19 are cross-sectional views illustrating a manufacturing process of a display device according to an embodiment.

Figure 12:
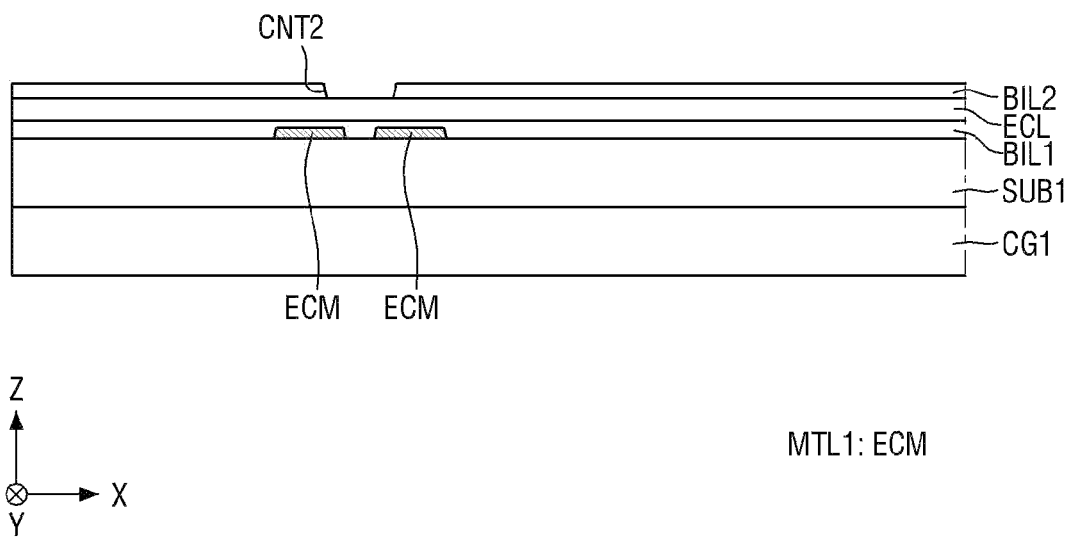
FIGS. 12 to 19 are schematic cross-sectional views illustrating a manufacturing process of a display device according to an embodiment.

In FIG. 12, a first carrier substrate CG1 may support each display device 10 in the manufacturing process of the display devices 10. For example, the first carrier substrate CG1 may be a carrier glass, but embodiments are not limited thereto.

The first substrate SUB1 may be disposed on the first carrier substrate CG1. The first substrate SUB1 may be a base substrate or a base member. For example, the first substrate SUB1 may include an insulating material such as a polymer resin such as polyimide (PI), but embodiments are not limited thereto.

The first metal layer MTL1 may be disposed on the first substrate SUB1. The first metal layer MTL1 may include at least one etching mark ECM. The first metal layer MTL1 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The first barrier insulating layer BIL1 may be disposed on the first metal layer MTL1 and the first substrate SUB1. The first barrier insulating layer BIL1 may include an inorganic layer capable of preventing permeation of air or moisture. For example, the first barrier insulating layer BIL1 may include at least one of a silicon nitride layer, a silicon oxynitride layer, a silicon oxide layer, a titanium oxide layer, an aluminum oxide layer, or an amorphous silicon layer, but embodiments are not limited thereto.

The etching control layer ECL may be disposed on the first barrier insulating layer BIL1. For example, the etching control layer ECL may include an insulating material such as a polymer resin such as polyimide (PI), but embodiments are not limited thereto.

The second barrier insulating layer BIL2 may be disposed on the etching control layer ECL. The second barrier insulating layer BIL2 may include an inorganic layer capable of preventing permeation of air or moisture. The second barrier insulating layer BIL2 may include the second contact hole CNT2. The second contact hole CNT2 may be etched from the top surface (or the upper surface) of the second barrier insulating layer BIL2 to expose a part of the top surface (or the upper surface) of the etching control layer ECL. The second contact hole CNT2 may be formed through a dry etching process or a wet etching process, but embodiments are not limited thereto.

Figure 13:
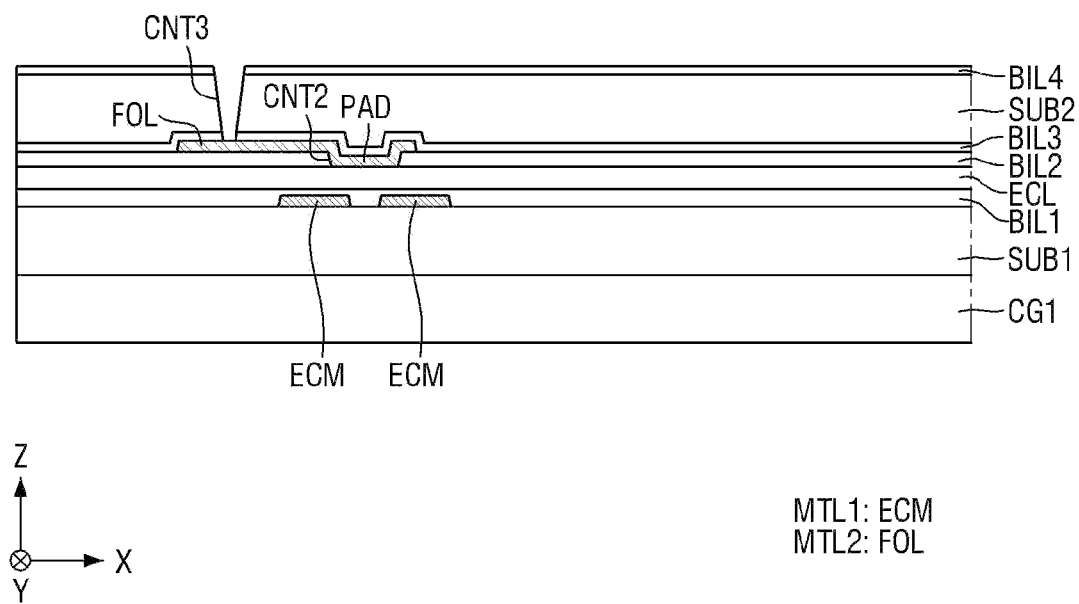

In FIG. 13, the second metal layer MTL2 may be disposed on the second barrier insulating layer BIL2. The second metal layer MTL2 may include a fan-out line FOL. The pad part PAD may be integral with the fan-out line FOL and inserted (or disposed) into the second contact hole CNT2. The second metal layer MTL2 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), or copper (Cu).

The third barrier insulating layer BIL3 may be disposed on the second barrier insulating layer BIL2 and the fan-out line FOL. The second substrate SUB2 and the fourth barrier insulating layer BIL4 may be sequentially stacked on the third barrier insulating layer BIL3. The third contact hole CNT3 may be etched from the top surface (or the upper surface) of the fourth barrier insulating layer BIL4 to penetrate the bottom surface (or the lower surface) of the third barrier insulating layer BIL3. For example, the third and fourth barrier insulating layers BIL3 and BIL4 and the second substrate SUB2 may be penetrated by a dry etching process or a wet etching process, but embodiments are not limited thereto. The top surface (or the upper surface) of the fan-out line FOL may be exposed by the third contact hole CNT3.

Figure 14:
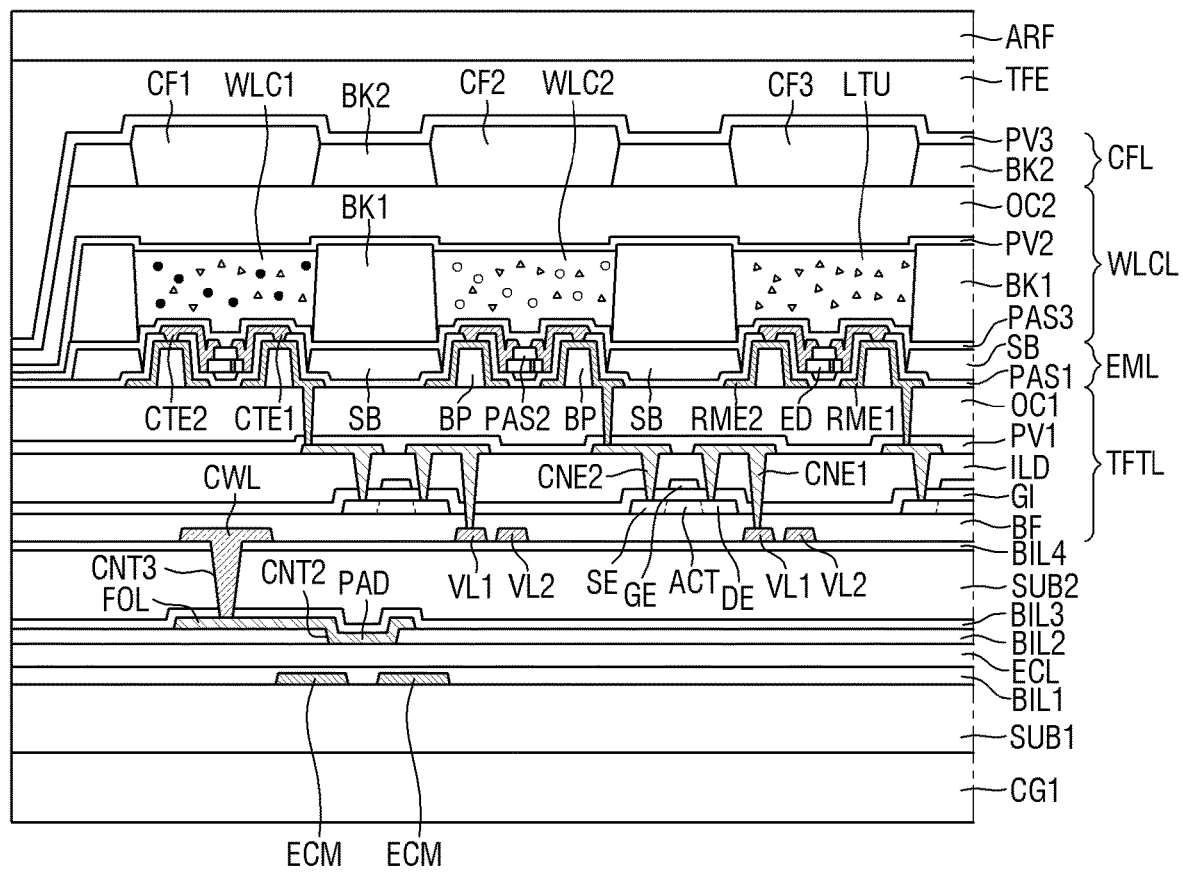

In FIG. 14, the display layer DPL may be stacked on the fourth barrier insulating layer BIL4. The thin film transistor layer TFTL, the light emitting element layer EML, the wavelength conversion layer WLCL, and the color filter layer CFL may be sequentially stacked on the fourth barrier insulating layer BIL4. The encapsulation layer TFE may cover the top and side surfaces of the display layer DPL. The anti-reflection film ARF may be formed on the encapsulation layer TFE.

Figure 15:
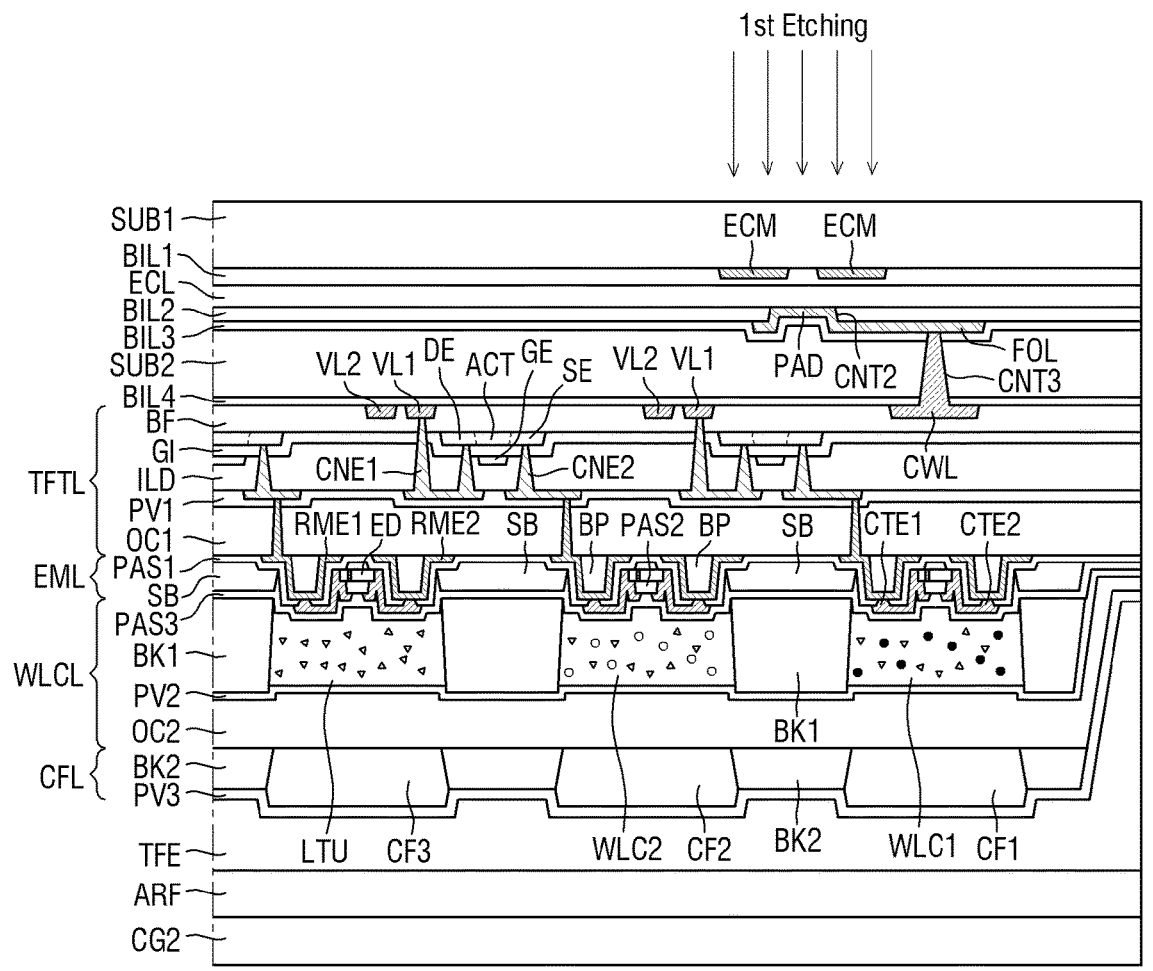
Figure 15:
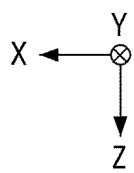
Figure 16:
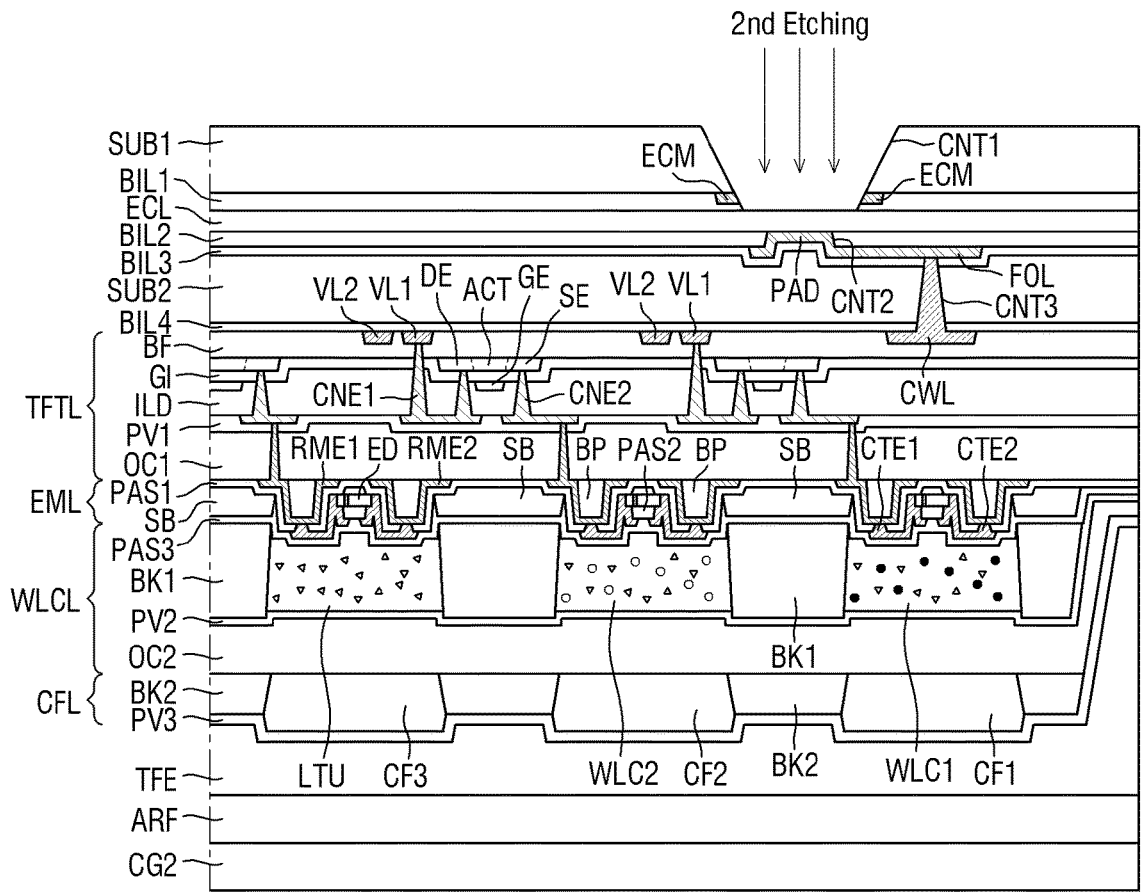
Figure 16:
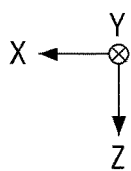

In FIGS. 15 and 16, the display devices 10 being manufactured may be vertically inverted to attach (or couple) the flexible film FPCB. The first carrier substrate CG1 may be removed from the first substrate SUB1. For example, the first carrier substrate CG1 may be removed from the bottom surface (or the lower surface) of the first substrate SUB1 by using a sacrificial layer disposed between the first carrier substrate CG1 and the first substrate SUB1, but embodiments are not limited thereto.

A second carrier substrate CG2 may be disposed on a surface of the anti-reflection film ARF. The second carrier substrate CG2 may support the vertically inverted display device 10. For example, the second carrier substrate CG2 may be a carrier glass, but embodiments are not limited thereto.

Figure 23:
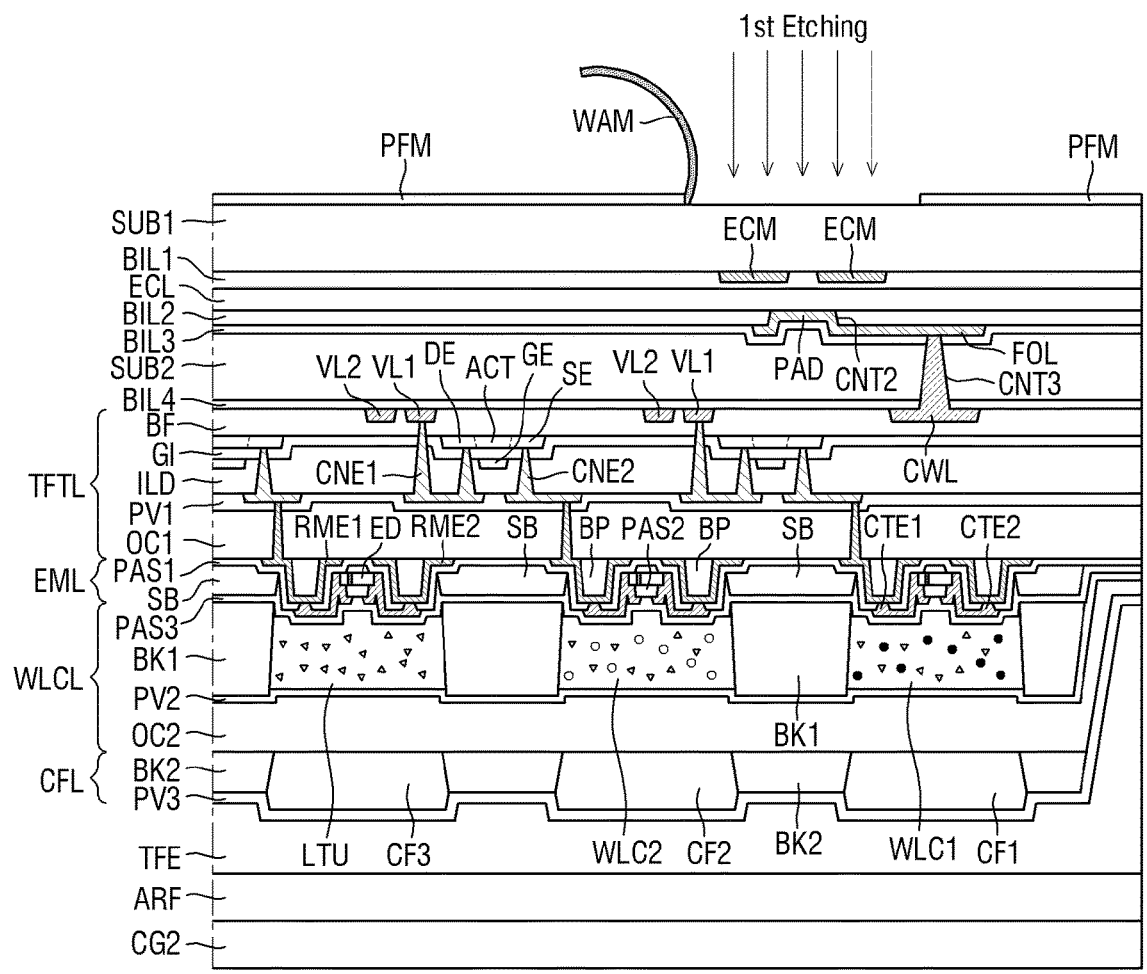

The first substrate SUB1, a part of the first metal layer MTL1, and the first barrier insulating layer BIL1 may be etched by a first etching process (e.g., 1st Etching in FIGS. 15 and 23). For example, the first etching process (e.g., 1st Etching in FIGS. 15 and 23) may be an atmospheric pressure (AP) plasma process by using an etching gas containing fluorine (F) radicals, but embodiments are not limited thereto. The etching gas may include at least one of nitrogen trifluoride ($NF_3$), carbon tetrafluoride ($CF_4$), fluoromethane ($CH_3F$), or difluoromethane ($CH_2F_2$), but embodiments are not limited thereto. The etching mark ECM may be formed by removing a part of the first metal layer MTL1 during the formation of the first contact hole CNT1. A first side surface of the etching mark ECM may be covered by the first barrier insulating layer BIL1 and a second side surface opposite to the first side surface of the etching mark ECM may be exposed by the first contact hole CNT1. The first etching process (e.g., 1st Etching in FIGS. 15 and 23) may be completed in case that the first metal layer MTL1 is removed, so that the etching mark ECM may control an etching depth in the etching process of the first substrate SUB1. After confirming that the first metal layer MTL1 is removed in the first etching process (e.g., 1st Etching in FIGS. 15 and 23), the manufacturer of the display devices 10 may change the etching gas to perform the second etching process.

Figure 17:
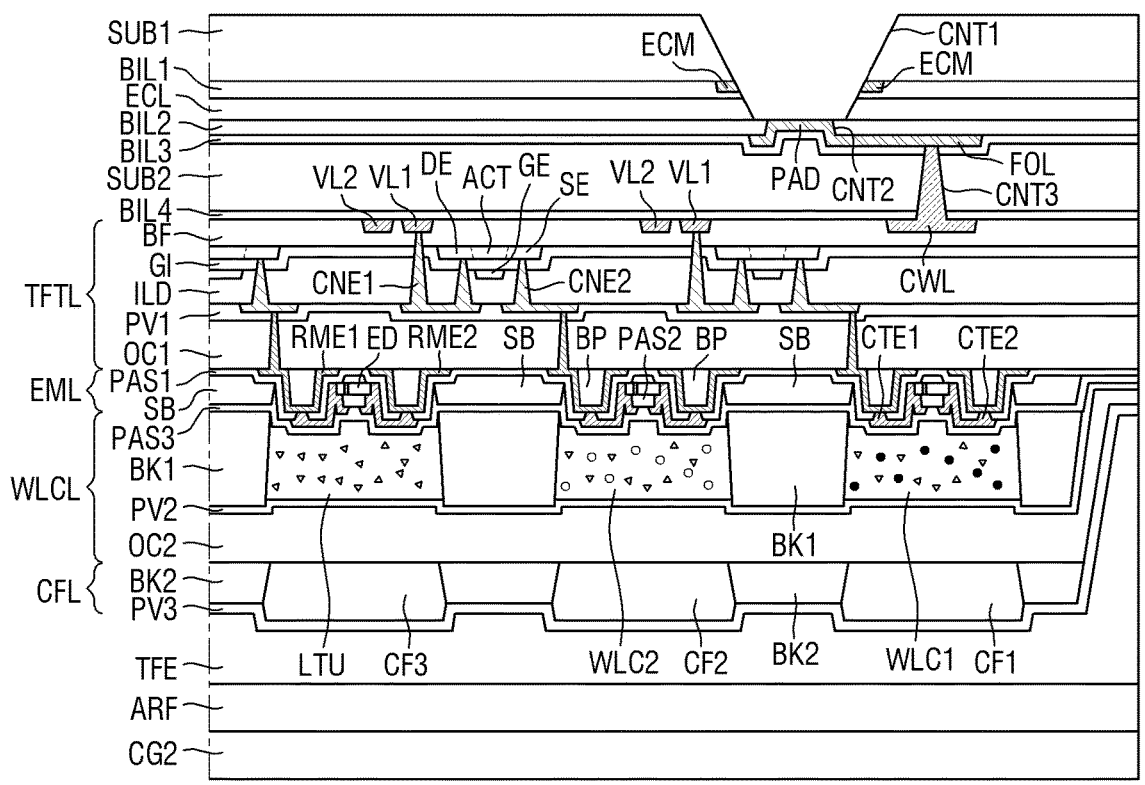
Figure 24:
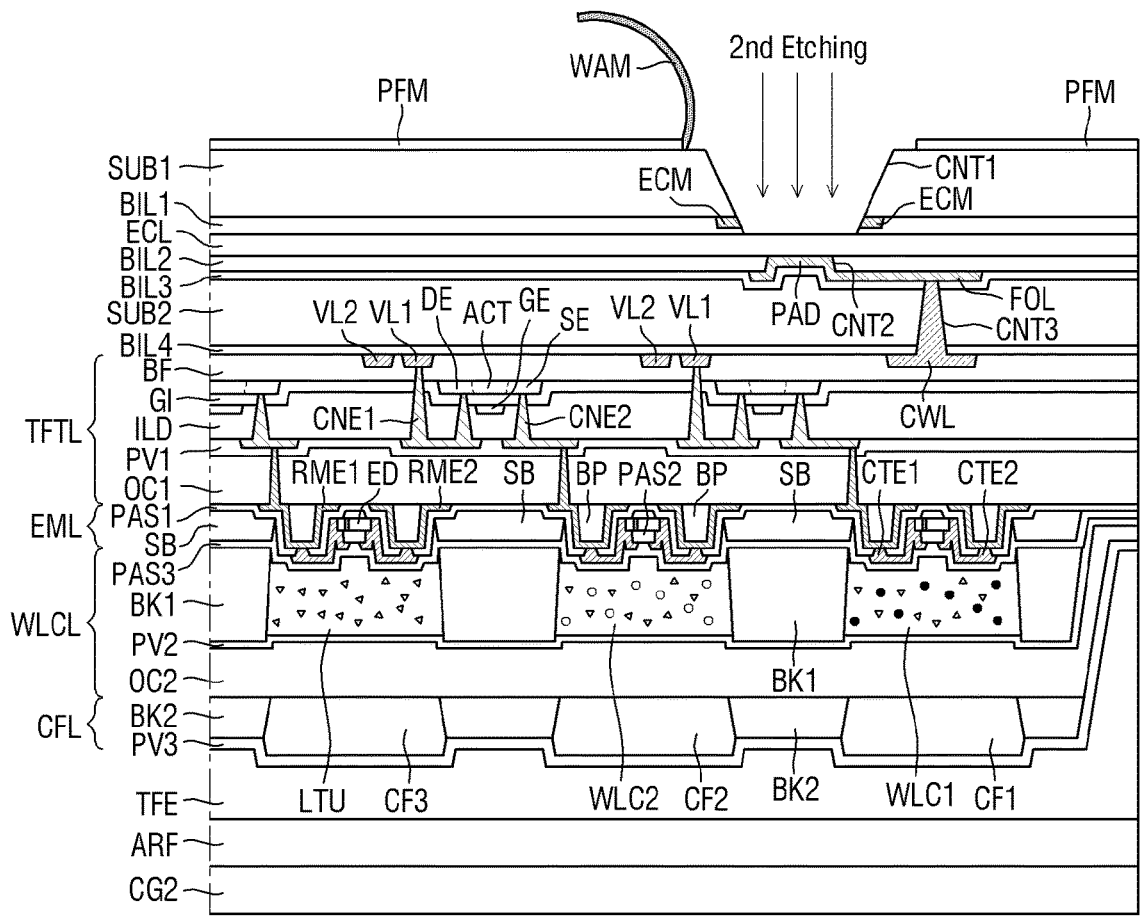

In FIG. 17, the etching control layer ECL may be etched by a second etching process (e.g., 2nd Etching in FIGS. 16 and 24). For example, the second etching process (e.g., 2nd Etching in FIGS. 16 and 24) may be an atmospheric pressure (AP) plasma process by using an etching gas that does not contain fluorine (F) radicals, but embodiments are not limited thereto. The second etching process (e.g., 2nd Etching in FIGS. 16 and 24) may not damage the pad part PAD exposed by the first contact hole CNT1 by using an etching gas that does not include fluorine (F) radicals. In the second etching process (e.g., 2nd Etching in FIGS. 16 and 24), only clean dry air (CDA) may be used without including fluorine (F) radicals, and the etching rate may be controlled by adjusting the flow rate of the etching gas.

Accordingly, the display devices 10 may control the etching depth by using the etching mark ECM in the AP Plasma process by using the etching gas, and may not damage the pad part PAD by using the etching gas that does not include fluorine (F) radicals in the second etching process (e.g., 2nd Etching in FIGS. 16 and 24). In the display devices 10, by forming the first contact hole CNT1 by using two plasma processes without using a separate laser facility, an etching rate may be remarkably increased and manufacturing costs may be reduced. For example, the etching mark ECM may function as an alignment mark in the first etching process (e.g., 1st Etching in FIGS. 15 and 23) and the second etching process (e.g., 2nd Etching in FIGS. 16 and 24), and thus may improve process precision during the formation of the first contact hole CNT1.

Figure 18:
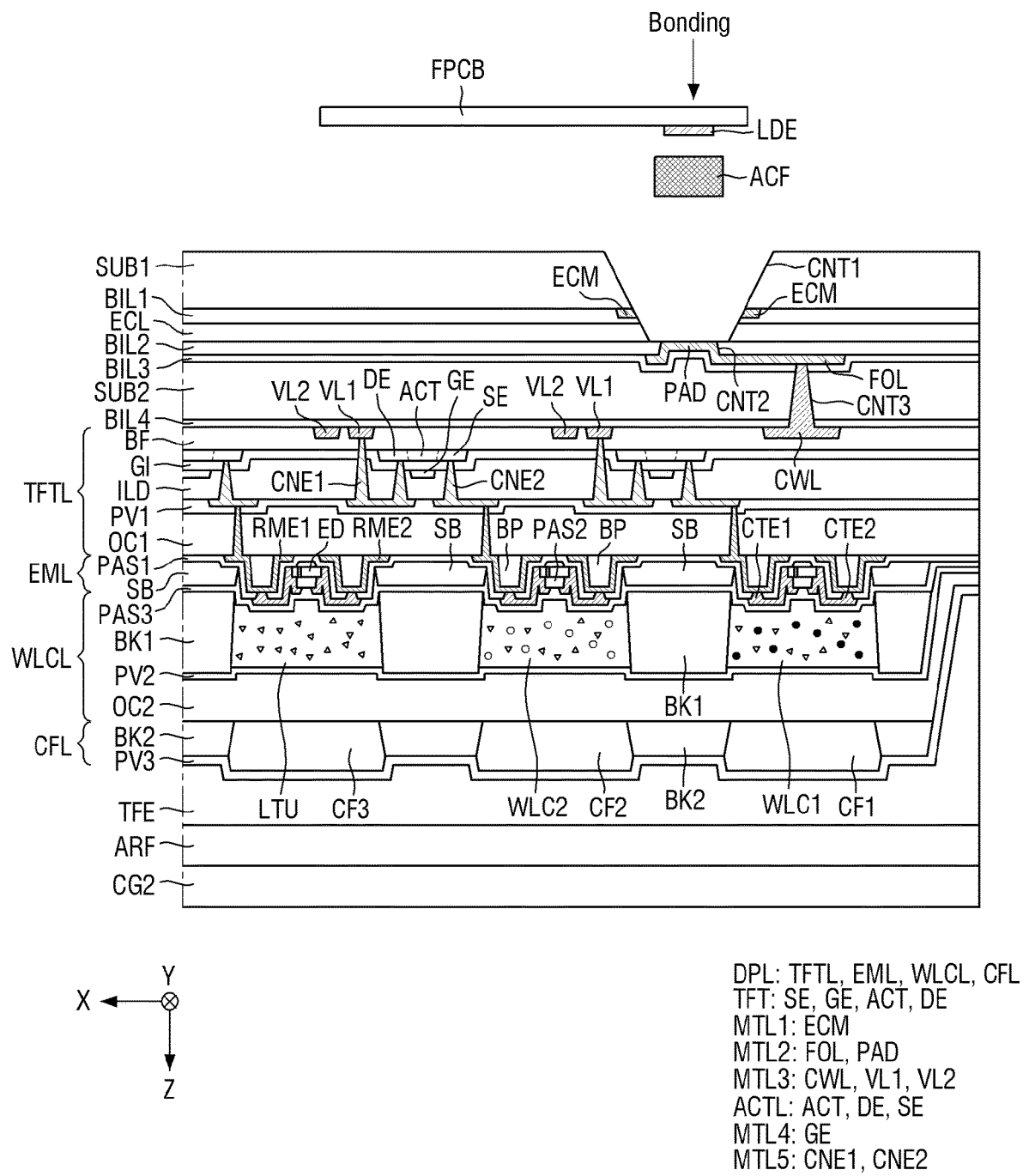
Figure 19:
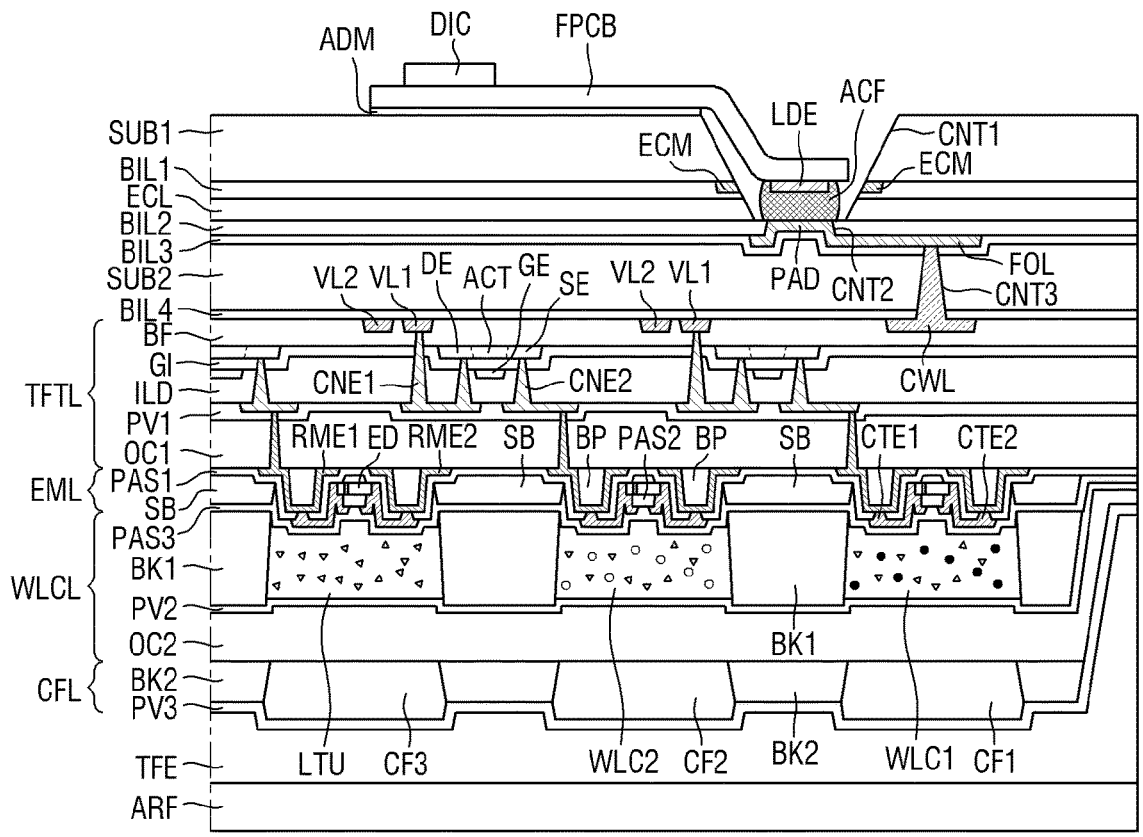
Figure 19:
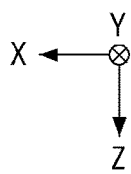

In FIGS. 18 and 19, the flexible film FPCB may be disposed on a surface of the first substrate SUB1. The flexible film FPCB and the lead electrode LDE may be aligned on the pad part PAD by an alignment process. For example, the lead electrode LDE of the flexible film FPCB may be attached (or coupled) to the pad part PAD through ultrasonic bonding or thermocompression bonding, but the bonding method is not limited thereto. The connection film ACF may have conductivity in an area in which the pad part PAD and the lead electrode LDE are in contact with each other, and may connect (e.g., electrically connect) the flexible film FPCB to the pad part PAD.

Figure 20:
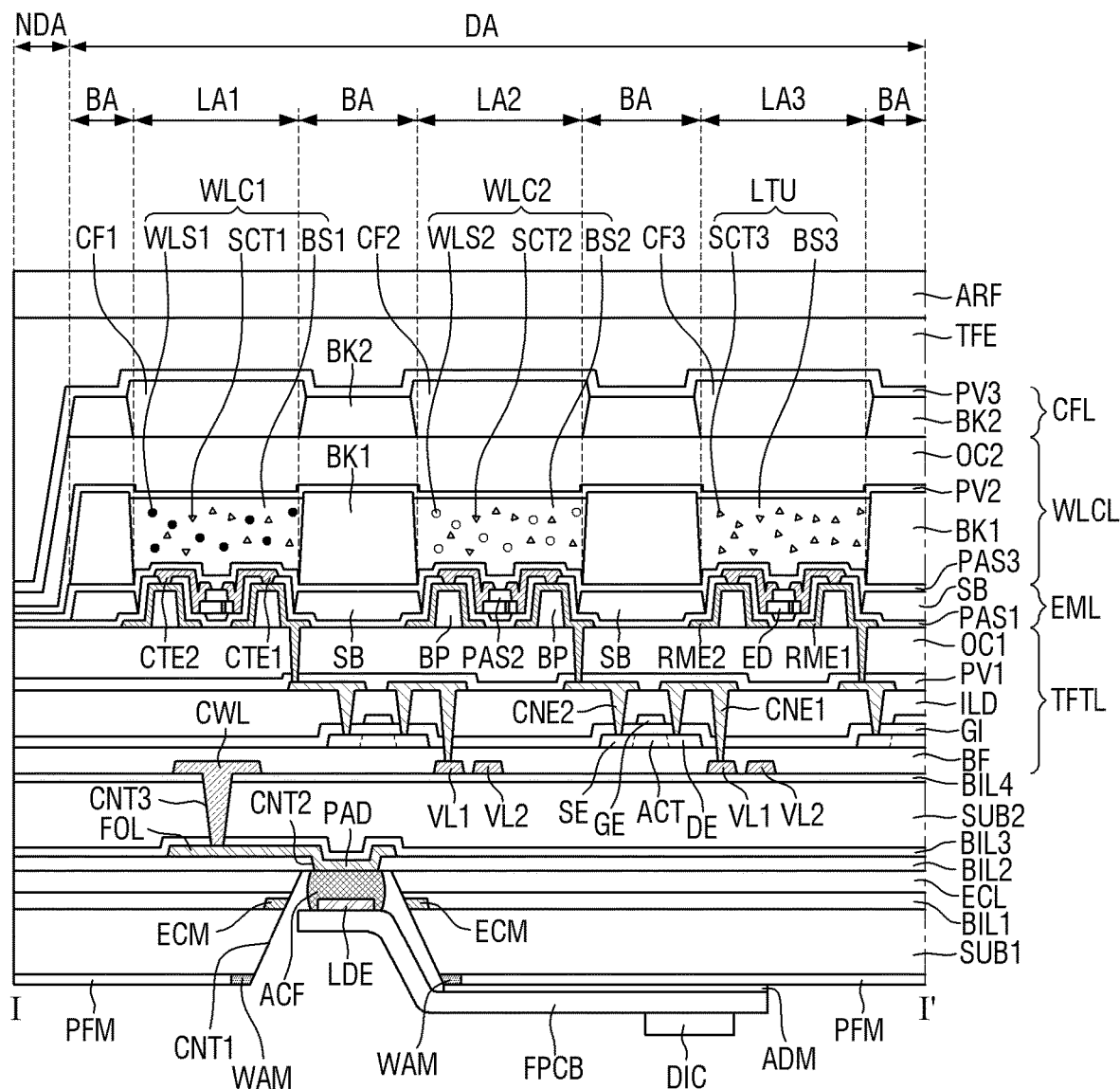
FIG. 20 is another example of a schematic cross-sectional view taken along line I-I' of FIG. 1.

FIG. 20 is another example of a schematic cross-sectional view taken along line I-I' of FIG. 1. The display device of FIG. 20 may further include a protective film PFM and a weak adhesive portion WAM in the display device of FIG. 2, and the same configuration as the above-described configuration will be briefly described or omitted for descriptive convenience.

Referring to FIG. 20, each display device 10 (e.g., the first display device 10-1) may include the first substrate SUB1, the first metal layer MTL1, the first barrier insulating layer BIL1, an etching control layer ECL, the second barrier insulating layer BIL2, the second metal layer MTL2, the third barrier insulating layer BIL3, the second substrate SUB2, the fourth barrier insulating layer BIL4, the display layer DPL, an encapsulation layer TFE, an anti-reflection film ARF, the protective film PFM, the weak adhesive portion WAM, the flexible film FPCB, and the display driver DIC.

The protective film PFM and the weak adhesive portion WAM may be disposed under the first substrate SUB1. The weak adhesive portion WAM may be formed by weakly tackifying (or reducing an adhesive of) a portion of the protective film PFM. The weak adhesive portion WAM may have a lower tackiness than the protective film PFM, and thus may be readily detached from the lower portion of the first substrate SUB1. The weak adhesive portion WAM may surround the first contact hole CNT1 in a plan view. For example, the weak adhesive portion WAM may be surrounded by the protective film PFM in a plan view, and may be in contact with the protective film PFM. The protective film PFM and the weak adhesive portion WAM may protect a lower portion of the first substrate SUB1. For example, in the process of cutting the display devices 10 into individual cells before the flexible film FPCB is bonded to the lower portion of the first substrate SUB1, the weak adhesive portion WAM may cover the first contact hole CNT1 to protect the pad part PAD.

The flexible film FPCB may be disposed under the protective film PFM and the weak adhesive portion WAM. The flexible film FPCB may be disposed on an edge portion of the bottom surface (or the lower surface) of each display device 10. The flexible film FPCB may be attached (or coupled) to the bottom surfaces (or the lower surfaces) of the protective film PFM and the weak adhesive portion WAM by using the adhesive member ADM. The flexible film FPCB may include the lead electrode LDE disposed on the top surface (or the upper surface) thereof on a side. The lead electrode LDE may be inserted (or disposed) into the first contact hole CNT1 to be connected (e.g., electrically connected) to the pad part PAD through the connection film ACF. The flexible film FPCB may support the display driver DIC disposed on the bottom surface (or the lower surface) on another side. The lead electrode LDE may be connected (e.g., electrically connected) to the display driver DIC through a lead line disposed on the bottom surface (or the lower surface) of the flexible film FPCB. Another side of the flexible film FPCB may be connected to a source circuit board under the first substrate SUB1. The flexible film FPCB may transmit a signal and a voltage of the display driver DIC to each display device 10.

FIGS. 21 to 29 are cross-sectional views illustrating a manufacturing process of a display device according to an embodiment. Here, the manufacturing process of the display device of FIG. 21 may be a subsequent process of the manufacturing process of the display device of FIG. 14.

Figure 21:
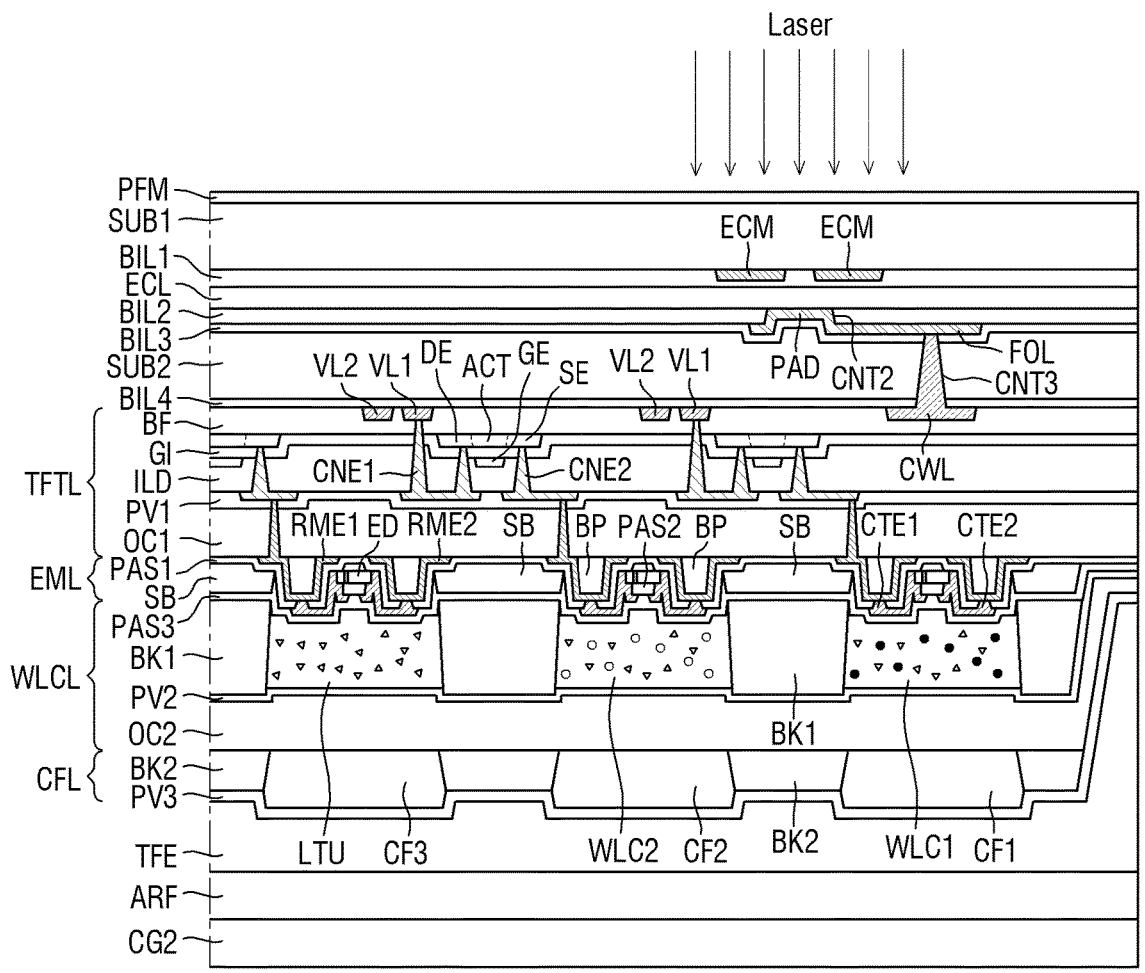
FIGS. 21 to 29 are schematic cross-sectional views illustrating a manufacturing process of a display device according to an embodiment.
Figure 22:
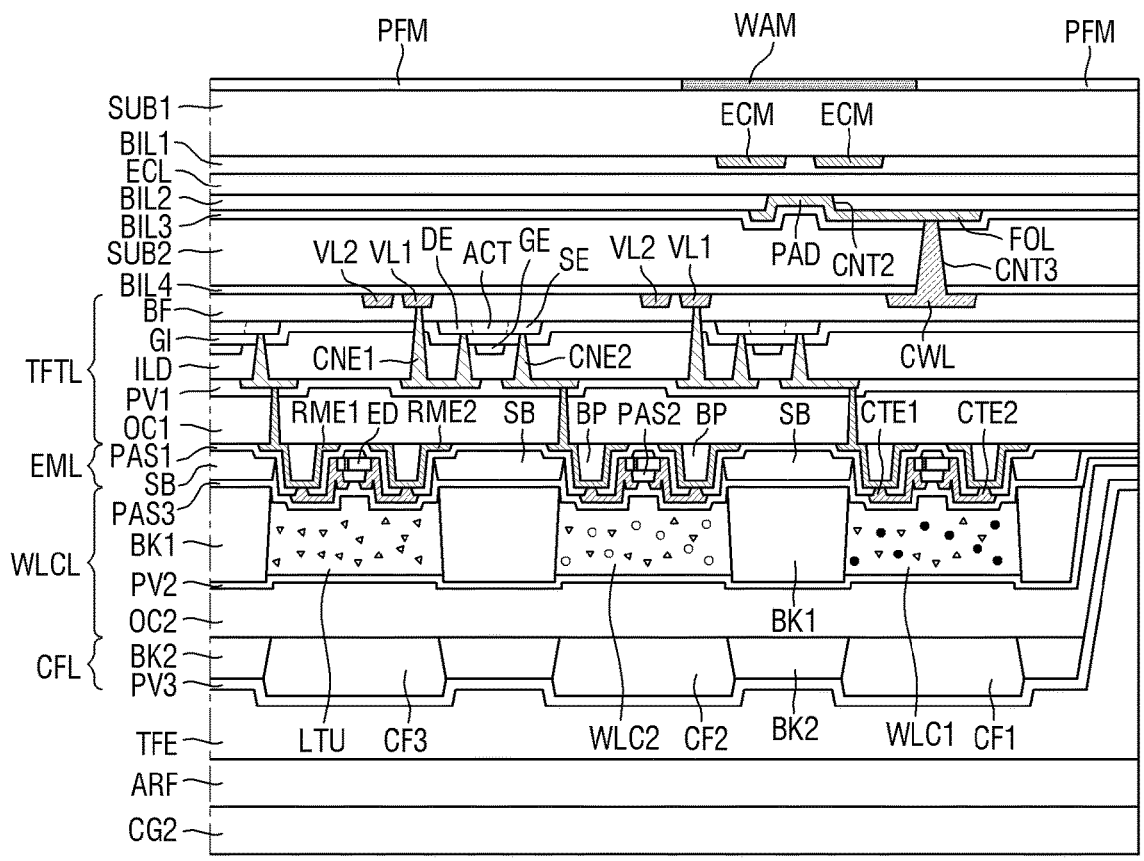
Figure 22:
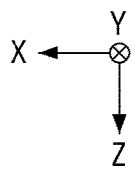

In FIGS. 21 and 22, the display devices 10 being manufactured may be vertically inverted to attach (or couple) the flexible film FPCB. The first carrier substrate CG1 may be removed from the first substrate SUB1. For example, the first carrier substrate CG1 may be removed from the bottom surface (or the lower surface) of the first substrate SUB1 by using a sacrificial layer disposed between the first carrier substrate CG1 and the first substrate SUB1, but embodiments are not limited thereto.

A second carrier substrate CG2 may be disposed on a surface of the anti-reflection film ARF. The second carrier substrate CG2 may support the vertically inverted display device 10. For example, the second carrier substrate CG2 may be a carrier glass, but embodiments are not limited thereto.

The protective film PFM may be disposed on a surface of the first substrate SUB1. The weak adhesive portion WAM may be formed by weakly tackifying (or reducing an adhesive of) a portion of the protective film PFM. For example, the weak adhesive portion WAM may be formed by irradiating a laser on a portion of the protective film PFM to be weakly adhesive. The weak adhesive portion WAM may overlap the etching mark ECM, but embodiments are not limited thereto.

Figure 25:
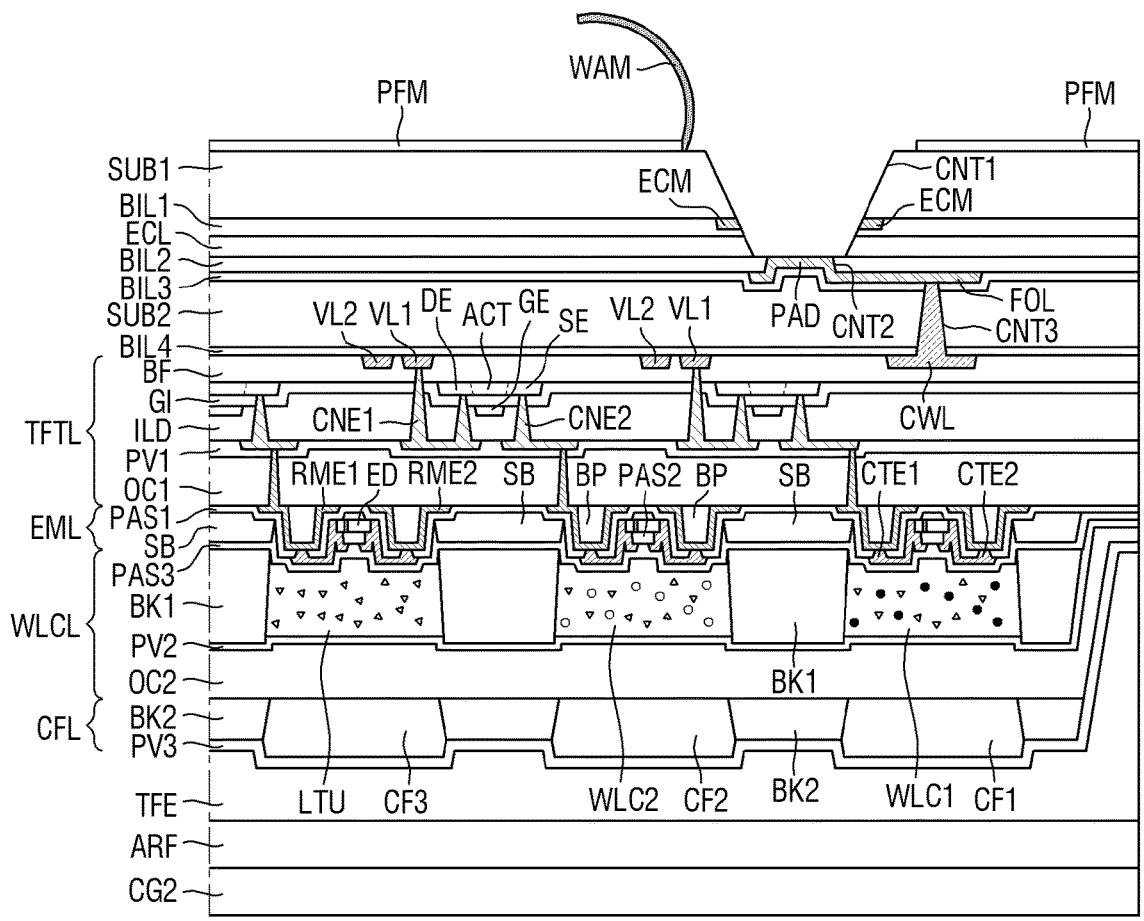
Figure 25:
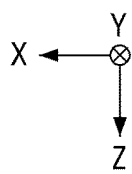

In FIGS. 23 to 25, the weak adhesive portion WAM may have a low tackiness, and thus may be readily detached from the lower portion of the first substrate SUB1. Since the weak adhesive portion WAM is separated from an area in which the first contact hole CNT1 is to be provided, the process of forming the first contact hole CNT1 may not be disturbed or hindered. The first etching process (e.g., 1st Etching in FIGS. 15 and 23) and the second etching process (e.g., 2nd Etching in FIGS. 16 and 24) of FIGS. 23 to 25 may proceed in the same way as the first etching process (e.g., 1st Etching in FIGS. 15 and 23) and the second etching process (e.g., 2nd Etching in FIGS. 16 and 24) disclosed in the description of FIGS. 15 to 17.

Figure 26:
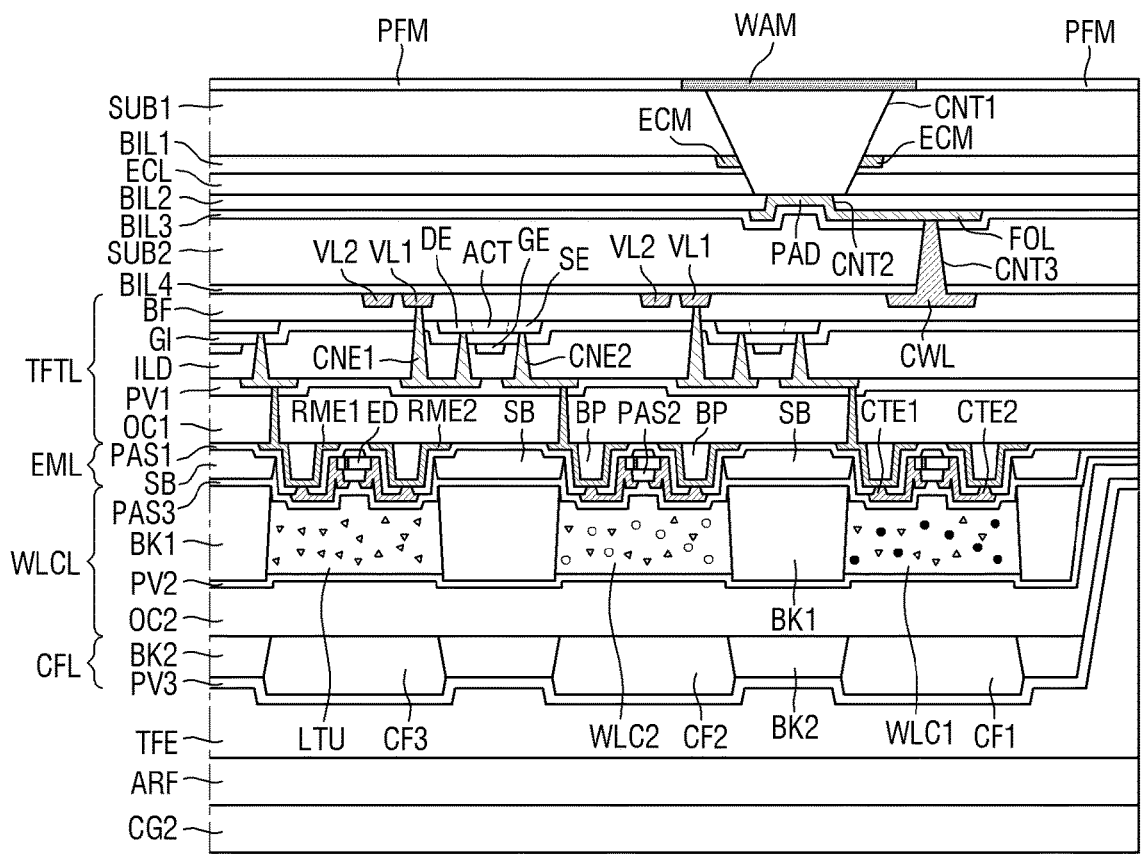

In FIG. 26, in case that the first contact hole CNT1 is formed and the pad part PAD is exposed, the weak adhesive portion WAM may cover the first contact hole CNT1. For example, by covering the first contact hole CNT1, the weak adhesive portion WAM may prevent the pad part PAD from being damaged by contact with the ground, or prevent foreign matters from being introduced into the first contact hole CNT1 in a cell cutting process of the display devices 10. For example, since the display devices 10 may perform the cell cutting process after forming the first contact hole CNT1 by using the weak adhesive portion WAM, the first contact holes CNT1 of each of the display devices 10 may be simultaneously formed on the mother substrate. Accordingly, by simultaneously performing the etching processes of forming the first contact holes CNT1 of the display devices 10, process time and manufacturing cost may be reduced.

Figure 27:
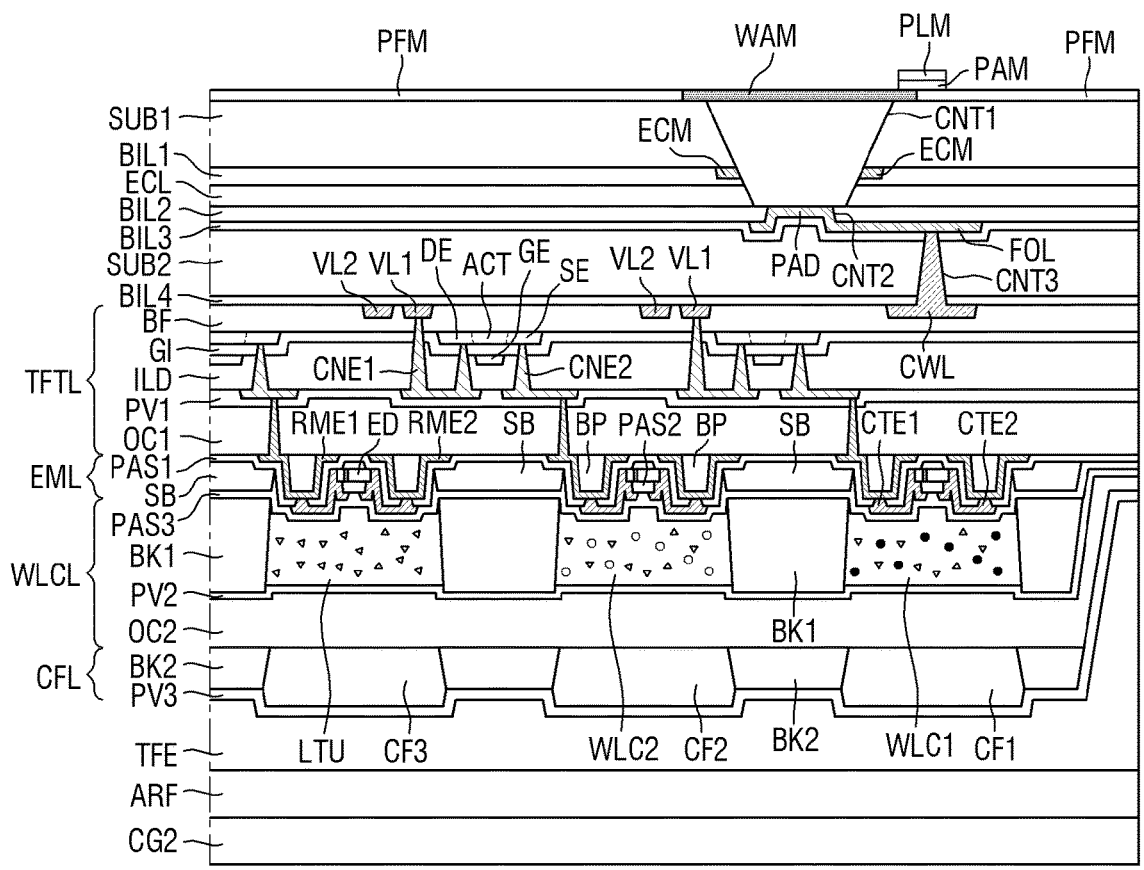
Figure 27:
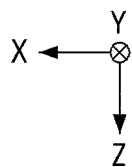

In FIG. 27, a film adhesive PAM and a cover film PLM may be disposed on the edge portion of the weak adhesive portion WAM. The film adhesive PAM may fix (or couple) the weak adhesive portion WAM to the opening of the first contact hole CNT1. The manufacturer of the display devices 10 may readily detach the weak adhesive portion WAM from the lower portion of the first substrate SUB1 by using the film adhesive PAM and the cover film PLM. Optionally, the film adhesive PAM and the cover film PLM may be omitted.

Figure 28:
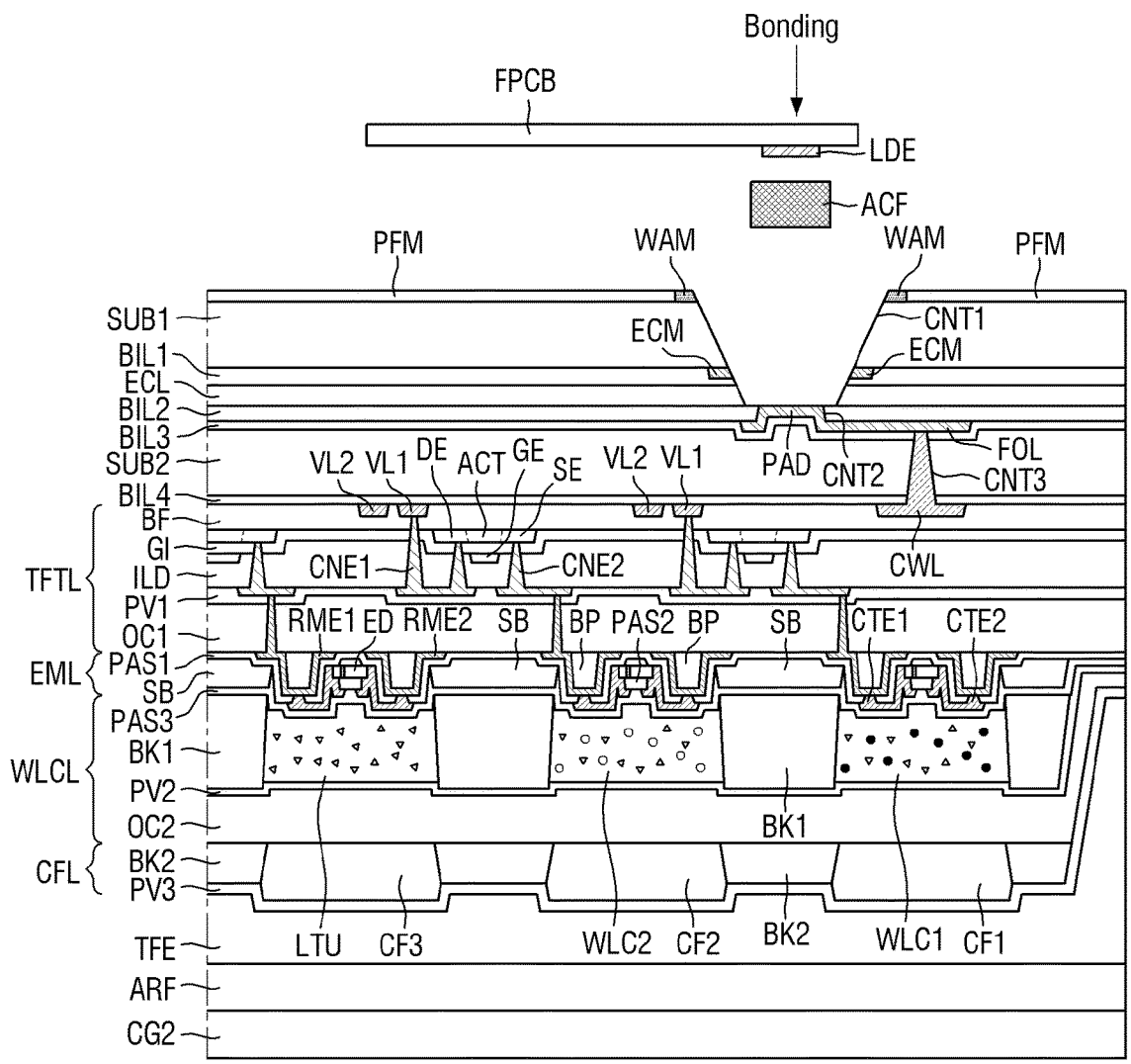
Figure 29:
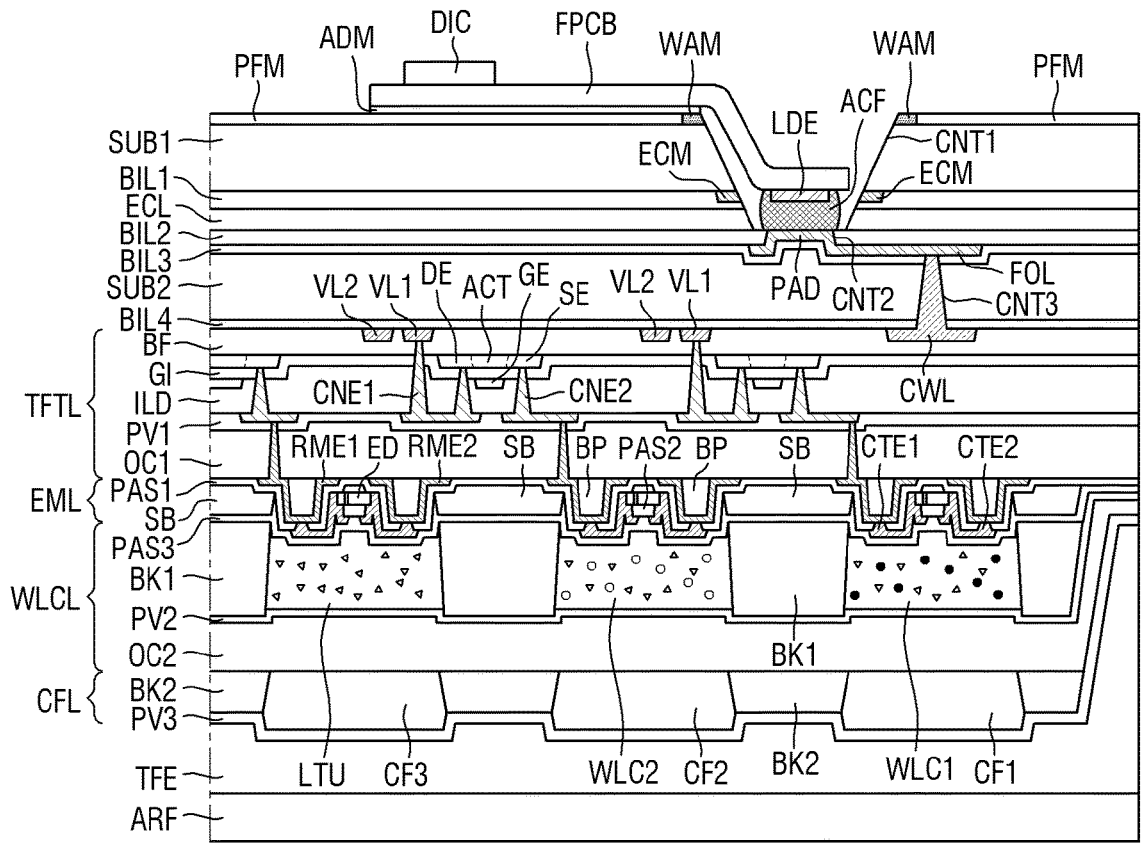

In FIGS. 28 and 29, in case that the cell cutting process of the display devices 10 is completed, the weak adhesive portion WAM covering the first contact hole CNT1 may be removed. Accordingly, the first contact hole CNT1 may be exposed, and a part of the weak adhesive portion WAM may surround the first contact hole CNT1. The bonding process of the flexible film FPCB of FIGS. 28 and 29 may be performed in the same manner as the bonding process of the flexible film FPCB disclosed in the description of FIGS. 18 and 19.

What is claimed is:
1. A display device comprising:
   a substrate;
   a first metal layer disposed on the substrate;
   a first barrier insulating layer disposed on the first metal layer;
   an etching control layer disposed on the first barrier insulating layer;
   a first contact hole passing through the substrate, the first barrier insulating layer, and the etching control layer;

a second barrier insulating layer disposed on the etching control layer and comprising a second contact hole;

a fan-out line disposed on the second barrier insulating layer and included in a second metal layer;

a pad part inserted into the second contact hole and included in the second metal layer, the pad part being integral with the fan-out line;

a display layer disposed on the fan-out line; and a flexible film disposed under the substrate and inserted into the first contact hole to be electrically connected to the pad part, wherein the first metal layer comprises an etching mark adjacent to the first contact hole.

2. The display device of claim 1, wherein the etching control layer comprises an insulating material including polyimide.

3. The display device of claim 1, wherein the etching mark comprises at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

4. The display device of claim 1, wherein the etching mark is disposed on a side of the first contact hole.

5. The display device of claim 1, further comprising:
a protective film disposed under the substrate; and
a weak adhesive portion surrounding the first contact hole in a plan view and being surrounded by the protective film in a plan view.

6. The display device of claim 5, wherein the weak adhesive portion is formed by reducing an adhesive of a portion of the protective film.

7. The display device of claim 1, wherein the display layer comprises:
a connection part disposed on the second metal layer and included in a third metal layer, the connection part connected to the fan-out line;
a data line included in the third metal layer and extending in a first direction; and
a high potential line included in the third metal layer and extending in the first direction.

8. The display device of claim 7, wherein the pad part is to supply a data voltage to the data line through the connection part, or is to supply a high potential voltage to the high potential line through the connection part.

9. The display device of claim 7, wherein
the display layer further comprises:
a thin film transistor including a gate electrode included in a fourth metal layer and an active layer overlapping the gate electrode; and
a connection electrode included in a fifth metal layer on the fourth metal layer, and
an end portion of the connection electrode is connected to the high potential line, and another end portion of the connection electrode is connected to the active layer of the thin film transistor.

10. The display device of claim 9, wherein
the display layer further comprises a light emitting element layer disposed on the fifth metal layer, and
the light emitting element layer comprises:
a first electrode connected to the connection electrode;
a second electrode adjacent to the first electrode, the first electrode and the second electrode disposed on a same layer; and
a light emitting element disposed between the first electrode and the second electrode.

11. The display device of claim 1, further comprising a display driver mounted on the flexible film to supply a data voltage, a power voltage, or a gate signal.

12. A tiled display device comprising:
a plurality of display devices, each of the plurality of display device comprising a display area comprising a plurality of pixels and a non-display area surrounding the display area; and
a bonding member that bonds the plurality of display devices, wherein
each of the plurality of display devices comprises:
a substrate;
a first metal layer disposed on the substrate;
a first barrier insulating layer disposed on the first metal layer;
an etching control layer disposed on the first barrier insulating layer;
a first contact hole passing through the substrate, the first barrier insulating layer, and the etching control layer;
a second barrier insulating layer disposed on the etching control layer and comprising a second contact hole;
a fan-out line disposed on the second barrier insulating layer and included in a second metal layer;
a pad part inserted into the second contact hole and included in the second metal layer, the pad part being integral with the fan-out line;
a display layer disposed on the fan-out line; and
a flexible film disposed under the substrate and inserted into the first contact hole to be electrically connected to the pad part, and
the first metal layer comprises an etching mark adjacent to the first contact hole.

* * * * *